(12) United States Patent
Hung et al.

(10) Patent No.: US 8,890,233 B2
(45) Date of Patent: Nov. 18, 2014

(54) 3D MEMORY ARRAY WITH IMPROVED SSL AND BL CONTACT LAYOUT

(75) Inventors: Chun-Hsiung Hung, Hsinchu (TW); Hang-Ting Lue, Hsinchu (TW); Shin-Jang Shen, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 383 days.

(21) Appl. No.: 13/018,110

(22) Filed: Jan. 31, 2011

(65) Prior Publication Data

US 2012/0007167 A1 Jan. 12, 2012

Related U.S. Application Data

(60) Provisional application No. 61/361,623, filed on Jul. 6, 2010.

(51) Int. Cl.

| | |
|---|---|
| H01L 29/792 | (2006.01) |
| H01L 27/06 | (2006.01) |
| H01L 27/10 | (2006.01) |
| H01L 27/102 | (2006.01) |
| H01L 27/115 | (2006.01) |
| H01L 29/66 | (2006.01) |
| G11C 17/16 | (2006.01) |
| H01L 27/02 | (2006.01) |
| G11C 13/00 | (2006.01) |
| G11C 16/04 | (2006.01) |

(52) U.S. Cl.
CPC ........ *H01L 27/1021* (2013.01); *H01L 27/0688* (2013.01); *H01L 27/101* (2013.01); *H01L 29/792* (2013.01); *G11C 2213/71* (2013.01); *H01L 27/11578* (2013.01); *G11C 17/16* (2013.01); *H01L 27/0207* (2013.01); *H01L 29/66833* (2013.01); *G11C 13/0002* (2013.01); *G11C 16/0483* (2013.01)
USPC ............................. 257/324; 257/329; 438/128

(58) Field of Classification Search
USPC ................. 257/211, 288, 314, 324, 329, 774; 438/102, 104, 128
See application file for complete search history.

(56) References Cited

U.S. PATENT DOCUMENTS

| | | | |
|---|---|---|---|
| 6,034,882 | A | 3/2000 | Johnson et al. |
| 6,906,940 | B1 | 6/2005 | Lue |

(Continued)

FOREIGN PATENT DOCUMENTS

| | | |
|---|---|---|
| EP | 1936681 A1 | 6/2008 |
| EP | 2048709 A2 | 4/2009 |

OTHER PUBLICATIONS

U.S. Appl. No. 12/430,290, filed Apr. 27, 2009 entitled Integrated Circuit 3D Memory Array and Manufacturing Methods by inventors Hsiang-Ian Lung and Hang-Ting Lue, consisting of 44 pages.

(Continued)

*Primary Examiner* — Errol Fernandes
(74) *Attorney, Agent, or Firm* — Kenta Suzue; Haynes Beffel & Wolfeld LLP

(57) ABSTRACT

A 3D memory device includes a plurality of ridges, in some embodiments ridge-shaped, in the form of multiple strips of conductive material separated by insulating material, arranged as bit lines which can be coupled through decoding circuits to sense amplifiers. The strips of conductive material have side surfaces on the sides of the stacks. A plurality of conductive lines arranged as word lines which can be coupled to row decoders, extends orthogonally over the plurality of stacks. The conductive lines conform to the surface of the stacks. Memory elements lie in a multi-layer array of interface regions at cross-points between side surfaces of the semiconductor material strips on the stacks and the conductive lines. The memory elements are programmable, like the antifuses or charge trapping structures. In some embodiments, the 3D memory is made using only two critical masks for multiple layers. Some embodiments include a staircase-shaped structure positioned at ends of the semiconductor material strips. Some embodiments include SSL interconnects on a metal layer parallel to the semiconductor material strips, and further SSL interconnects on a higher metal layer, parallel to the word lines.

10 Claims, 28 Drawing Sheets

(56) References Cited

U.S. PATENT DOCUMENTS

| | | | |
|---|---|---|---|
| 7,081,377 B2 | 7/2006 | Cleeves | |
| 7,129,538 B2 | 10/2006 | Lee et al. | |
| 7,177,169 B2 | 2/2007 | Scheuerlein | |
| 7,796,437 B2 * | 9/2010 | Cazzaniga | 365/185.21 |
| 8,188,517 B2 * | 5/2012 | Choi | 257/211 |
| 8,331,149 B2 * | 12/2012 | Choi et al. | 365/185.05 |
| 2005/0280061 A1 | 12/2005 | Lee | |
| 2008/0101109 A1 | 5/2008 | Haring-Bolivar et al. | |
| 2009/0097321 A1 | 4/2009 | Kim et al. | |
| 2009/0184360 A1 | 7/2009 | Jin et al. | |
| 2010/0270593 A1 | 10/2010 | Lung et al. | |

OTHER PUBLICATIONS

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, pp. 122-123.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Lai et al., "Highly Reliable MA BE-SONOS (Metal-Al2 03 Bandgap Engineered SONOS) Using a SiO2 Buffer Layer" VLSI Technology, Systems and Applications, 2008, VLSI-TSA 2008 International Symposium on Apr. 21-23, 2008, pp. 58-59.

Paul et al., "Impact of a Process Variation on Nanowire and Nanotube Device Performance," 2007 IEEE, pp. 2369-2376.

Choi et al., "Performance Breakthrough in NOR Flash Memory With Dopant-Segregated Schottky-Barrier (DSSB) SONOS Devices," 2009 Symposium on VLSI Technology Digest of Technical Papers, pp. 222-223.

* cited by examiner

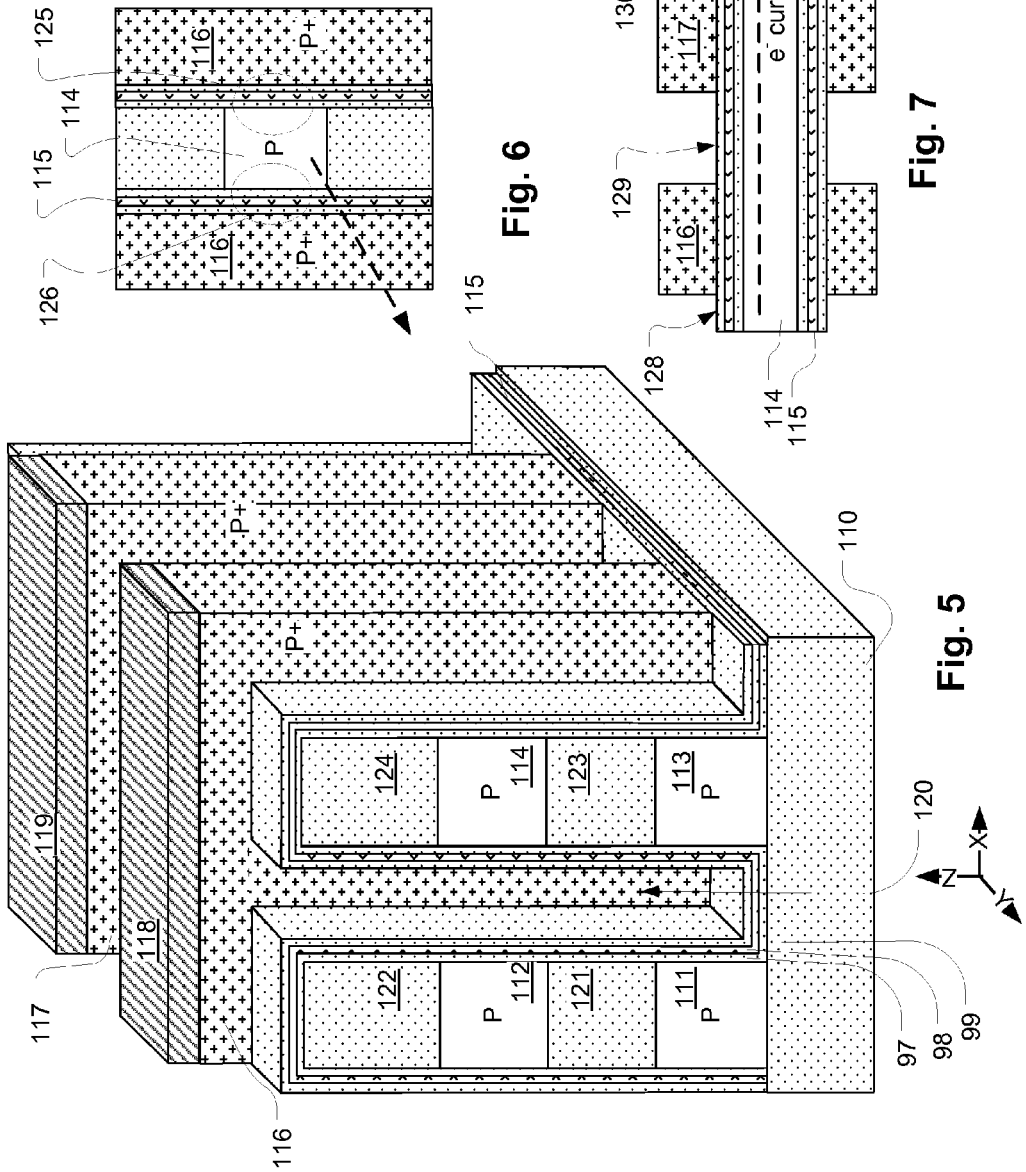

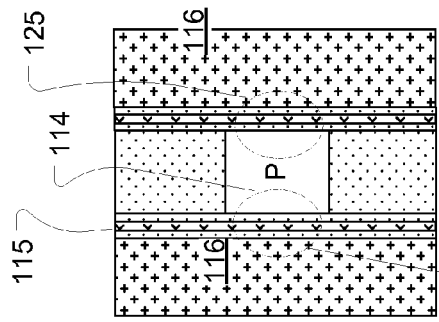
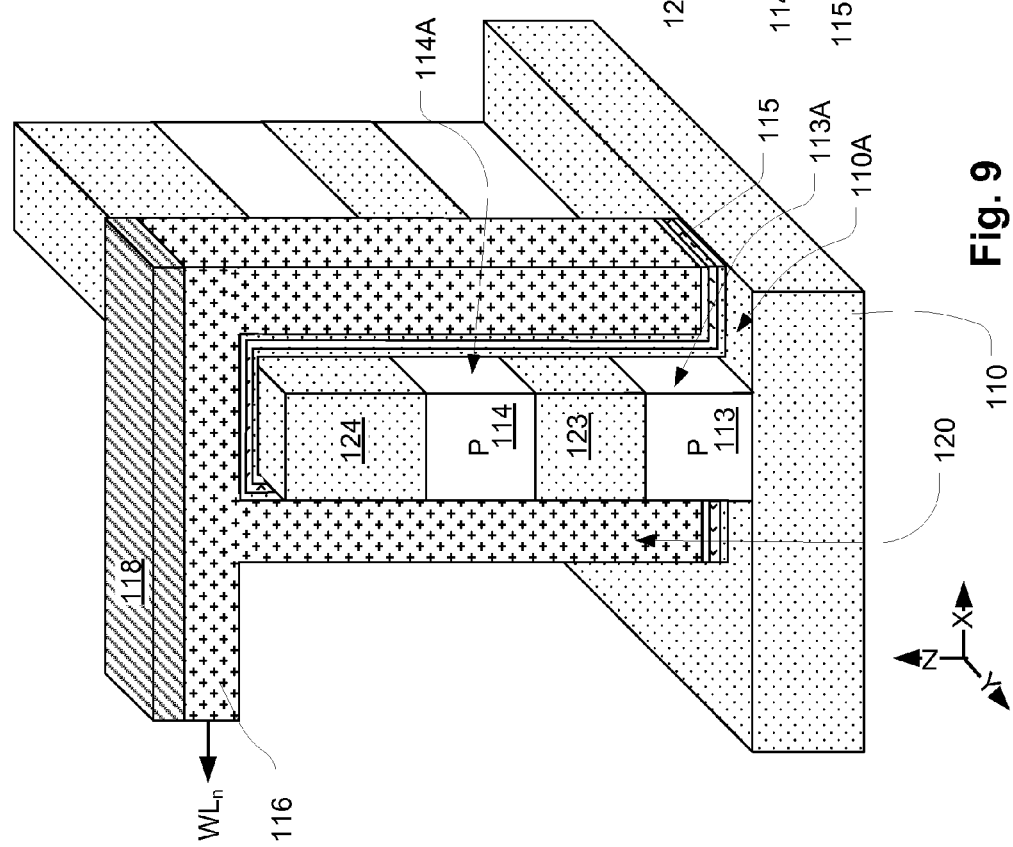

3D MEMORY ARRAY WITH IMPROVED SSL AND BL CONTACT LAYOUT

REFERENCE TO RELATED APPLICATION

This application claims the benefit of U.S. Provisional Application No. 61/361,623, filed on 6 Jul. 2010 and is incorporated herein by reference.

RELATED APPLICATION

This application is related to U.S. application Ser. No. 12/692,798, filed on 25 Jan. 2010 incorporated herein by reference.

BACKGROUND

1. Field

The present technology relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory", IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, November 2003. In the design described in Johnson et al., multiple layers of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

In the processes described in Lai, et al., Jung, et al. and Johnson et al., there are several critical lithography steps for each memory layer. Thus, the number of critical lithography steps needed to manufacture the device is multiplied by the number of layers that are implemented. So, although the benefits of higher density are achieved using 3D arrays, the higher manufacturing costs limit the use of the technology.

Another structure that provides vertical NAND cells in a charge trapping memory technology is described in Tanaka et al., "Bit Cost Scalable Technology with Punch and Plug Process for Ultra High Density Flash Memory", 2007 Symposium on VLSI Technology Digest of Technical Papers; 12-14 Jun. 2007, pages: 14-15. The structure described in Tanaka et al. includes a multi-gate field effect transistor structure having a vertical channel which operates like a NAND gate, using silicon-oxide-nitride-oxide-silicon SONOS charge trapping technology to create a storage site at each gate/vertical channel interface. The memory structure is based on a pillar of semiconductor material arranged as the vertical channel for the multi-gate cell, with a lower select gate adjacent the substrate, and an upper select gate on top. A plurality of horizontal control gates is formed using planar electrode layers that intersect with the pillars. The planar electrode layers used for the control gates do not require critical lithography, and thereby save costs. However, many critical lithography steps are required for each of the vertical cells. Also, there is a limit in the number of control gates that can be layered in this way, determined by such factors as the conductivity of the vertical channel, program and erase processes that are used and so on.

With the 3D array, memory cells and interconnects are densely packed.

It is desirable to provide a structure for three-dimensional integrated circuit memory with a low manufacturing cost, including reliable, very small memory elements, and small footprint for interconnects and contacts.

SUMMARY

One aspect of the technology is a 3D memory device, with an integrated circuit substrate; a plurality of stacks of semiconductor material strips; a plurality of conductive lines; and memory elements.

The plurality of stacks (in some embodiments ridge-shaped) include at least two semiconductor material strips separated by insulating material into different plane positions. The semiconductor material strips that share a same plane position are connected to a same bit line contact by a staircase-shaped structure. Steps of the staircase-shaped structure are positioned at ends of the semiconductor material strips. In several embodiments, such positioning saves chip area, in contrast with connecting the layers to bit line contacts that are spaced away from the ends of the semiconductor material strips.

The plurality of conductive lines are arranged orthogonally over, and have surfaces conformal with, the plurality of stacks. A 3D array of interface regions is established at cross-points between surfaces of the semiconductor material strips and the plurality of conductive lines.

The memory elements are in the interface regions. This establishes a 3D array of memory cells accessible via the plurality of semiconductor material strips and the plurality of conductive lines.

Another aspect of the technology is a 3D memory device, with an integrated circuit substrate; a plurality of stacks of semiconductor material strips; several pluralities of conductive lines; memory elements; and a plurality of conductive conformal structures.

The plurality of stacks (in some embodiments ridge-shaped) include at least two semiconductor material strips separated by insulating material into different plane positions. The semiconductor material strips that share a same plane position are interconnected.

Several pluralities of conductive lines include a first, a second, and a third plurality of conductive lines.

The first plurality of conductive lines correspond to word lines in many embodiments. The first plurality of conductive lines is arranged orthogonally over, and has surfaces conformal with, the plurality of stacks. A 3D array of interface regions is established at cross-points between surfaces of the semiconductor material strips and the first plurality of conductive lines.

The memory elements are in the interface regions. This establishes a 3D array of memory cells accessible via the plurality of semiconductor material strips and the first plurality of conductive lines.

Each conductive conformal structure of the plurality of conductive conformal structures is over a different stack of the plurality of stacks. In some embodiments, the SSL line signals electrically connect to different conductive conformal structures, via the second plurality of conductive lines and the third plurality of conductive lines.

The second plurality of conductive lines are arranged over the plurality of stacks, and parallel to the semiconductor material strips. Each conductive line of the second plurality of conductive lines is electrically connected to a different conductive conformal structure of the plurality of conductive conformal structures.

The third plurality of conductive lines arranged over, and parallel to, the first plurality of conductive lines. Each conductive line of the third plurality of conductive lines is connected to a different conductive line of the second plurality of conductive lines.

In some embodiments, the second plurality of conductive lines and the third plurality of conductive lines are different metal layer lines, which together electrically connect the SSL line signals to the different conductive conformal structures.

Also described herein is a 3D, buried-channel, junction-free NAND flash structure based on BE-SONOS technology.

Other aspects and advantages of the present technology can be seen on review of the drawings, the detailed description and the claims, which follow.

BRIEF DESCRIPTION OF THE DRAWINGS

FIG. 5 is a perspective illustration of a 3D NAND-flash memory structure as described herein including a plurality of planes of semiconductor material strips parallel to a Y-axis, arranged in a plurality of ridge-shaped stacks, a charge trapping memory layer on side surfaces of the semiconductor material strips, and a plurality of conductive lines with conformal bottom surfaces arranged over the plurality of ridge-shaped stacks.

FIG. 6 is a cross-section of a memory cell taken in the X-Z plane from the structure of FIG. 5.

FIG. 7 is a cross-section of a memory cell taken in the X-Y plane from the structure of FIG. 5.

FIG. 9 is a perspective illustration of an alternative implementation of a 3D NAND-flash memory structure like that of FIG. 5, where the memory layer is removed between the conductive lines.

FIG. 10 is a cross-section of a memory cell taken in the X-Z plane from the structure of FIG. 9.

FIG. 11 is a cross-section of a memory cell taken in the X-Y plane from the structure of FIG. 9.

DETAILED DESCRIPTION

A detailed description of embodiments of the present technology is provided with reference to the Figures.

Figure 1:
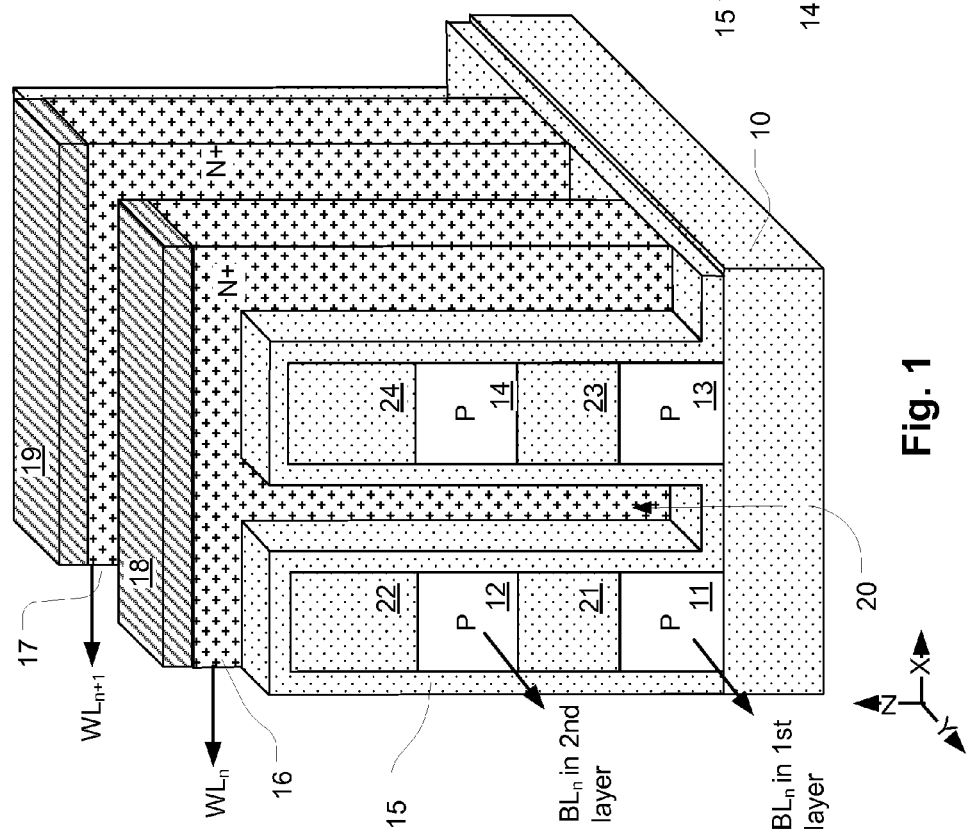
FIG. 1 is a perspective illustration of a 3D memory structure as described herein including a plurality of planes of semiconductor material strips parallel to a Y-axis, arranged in a plurality of ridge-shaped stacks, a memory layer on side surfaces of the semiconductor material strips, and a plurality of conductive lines with conformal bottom surfaces arranged over the plurality of ridge-shaped stacks.

FIG. 1 is a perspective drawing of a 2×2 portion of a three-dimensional programmable resistance memory array with fill material removed from the drawing to give a view of the stacks of semiconductor material strips and orthogonal conductive lines that make up the 3D array. In this illustration, only 2 planes are shown. However, the number of planes can be extended to very large numbers. As shown in FIG. 1, the memory array is formed on an integrated circuit substrate having an insulating layer 10 over underlying semiconductor or other structures (not shown). The memory array includes a plurality of stacks of semiconductor material strips 11, 12, 13, 14 separated by insulating material 21, 22, 23, 24. The stacks are ridge-shaped oriented along the Y-axis as illustrated in the figure, so that the semiconductor material strips 11-14 can be configured as bit lines, and extend out of the substrate. Semiconductor material strips 11 and 13 can act as bit lines in a first memory plane. Semiconductor material strips 12 and 14 can act as bit lines in a second memory plane. A layer 15 of memory material, such as an anti-fuse material, coats the plurality of stacks of semiconductor material strips in this example, and at least on the side walls of the semiconductor material strips in other examples. A plurality of conductive lines 16, 17 is arranged orthogonally over the plurality of stacks of semiconductor material strips. The conductive lines 16, 17 have surfaces conformal with the plurality of stacks of semiconductor material strips, filling the trenches (e.g. 20) defined by the plurality of stacks, and defining a multi-layer array of interface regions at cross-points between side surfaces of the semiconductor material strips 11-14 on the stacks and conductive lines 16, 17. A layer of silicide (e.g. tungsten silicide, cobalt silicide, titanium silicide) 18, 19 can be formed over the top surfaces of the conductive lines 16, 17.

The layer 15 of memory material can consist of an anti-fuse material such as a silicon dioxide, silicon oxynitride or other silicon oxide, for example having a thickness on the order of 1 to 5 nanometers. Other anti-fuse materials may be used, such as silicon nitride. The semiconductor material strips 11-14 can be a semiconductor material with a first conductivity type (e.g. p-type). The conductive lines 16, 17 can be a semiconductor material with a second conductivity type (e.g. n-type). For example, the semiconductor material strips 11-14 can be made using p-type polysilicon while the conductive lines 16, 17 can be made using relatively heavily doped n+-type polysilicon. The width of the semiconductor material strips should be enough to provide room for a depletion region to support the diode operation. As result, memory cells comprising a rectifier formed by the p-n junction with a programmable anti-fuse layer in between the anode and cathode are formed in the 3D array of cross-points between the polysilicon strips and lines. In other embodiments, different programmable resistance memory materials can be used, including transition metal oxides like tungsten oxide on tungsten or doped metal oxide semiconductor material strips. Such materials can be programmed and erased, and can be implemented for operations storing multiple bits per cell.

Figure 2:
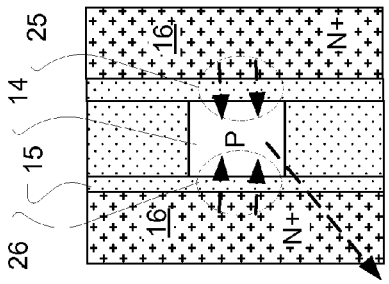
FIG. 2 is a cross-section of a memory cell taken in the X-Z plane from the structure of FIG. 1.
Figure 3:
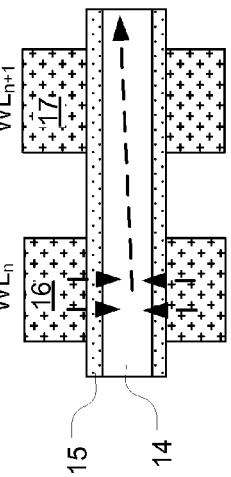
FIG. 3 is a cross-section of a memory cell taken in the X-Y plane from the structure of FIG. 1.

FIG. 2 shows a cross-section view cut in the X-Z plane of the memory cell formed at the intersection of conductive line 16 and semiconductor material strip 14. Active regions 25, 26 are formed on the both sides of the strip 14 between the conductive line 16 and the strip 14. In the native state, a layer 15 of anti-fuse material has a high resistance. After programming, the anti-fuse material breaks down, causing one or both of the active areas 25, 26 within the anti-fuse material to assume a low resistance state. In the embodiment described here, each memory cell has two active regions 25, 26, one on each side of the semiconductor material strip 14. FIG. 3 shows a cross-section view in the X-Y plane of the memory cell formed at the intersection of the conductive lines 16, 17 and the semiconductor material strip 14. The current path from the word line defined by the conductive line 16 through the layer 15 of anti-fuse material and down the semiconductor material strip 14 is illustrated.

Electron current as illustrated by the solid arrows in FIG. 3, flows from the n+ conductive lines 16 into the p-type semiconductor material strips, and along the semiconductor material strip (—arrow) to sense amplifiers where it can be measured to indicate the state of a selected memory cell. In a typical embodiment, using a layer of silicon oxide about one nanometer thick as the anti-fuse material, a programming pulse may comprise a 5 to 7 volt pulse having a pulse width of about one microsecond, applied under control of on-chip control circuits as described below with reference to FIG. 28. A read pulse may comprise a 1 to 2 volt pulse having a pulse width that depends on the configuration, applied under control of on-chip control circuits as described below with reference to FIG. 28. The read pulse can be much shorter than the programming pulse.

Figure 4:
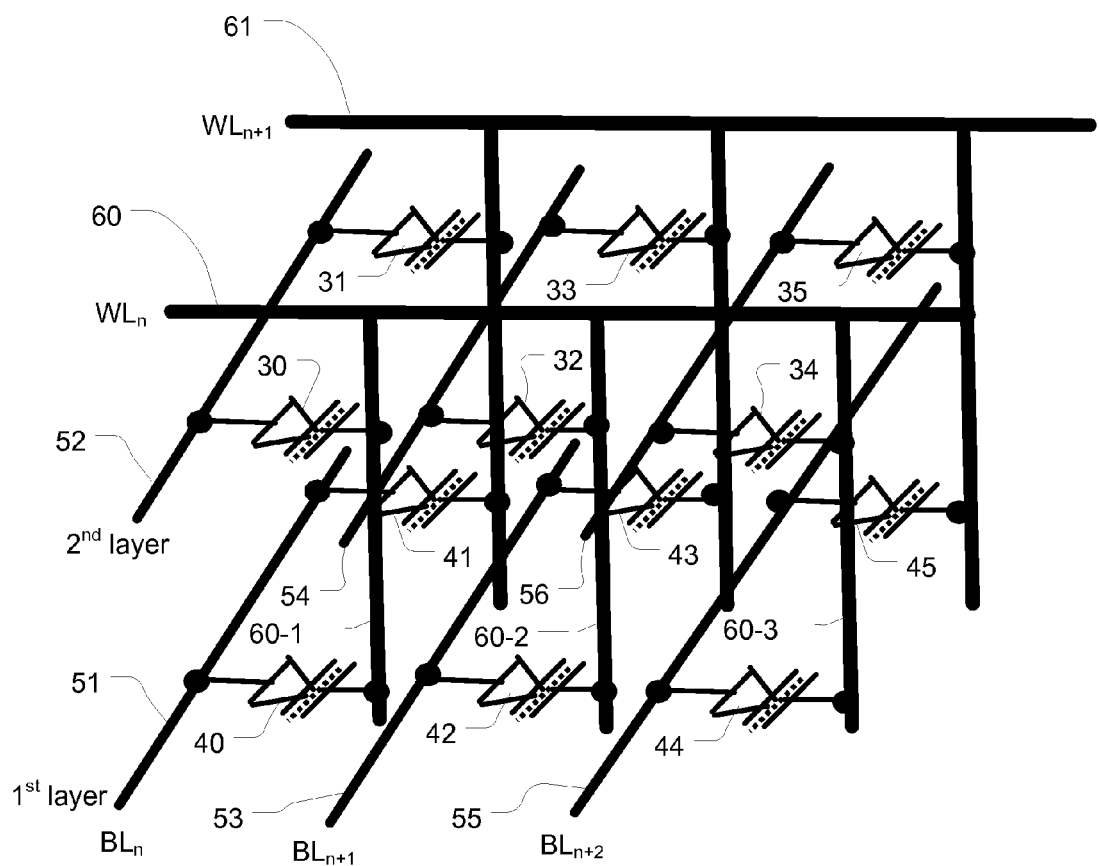
FIG. 4 is a schematic diagram of an anti-fuse based memory having the structure of FIG. 1.

FIG. 4 is a schematic diagram showing 2 planes of memory cells having 6 cells each. The memory cells are represented by diode symbols with a dashed line representing the layer of anti-fuse material between the anode and the cathode. The 2 planes of memory cells are defined at the cross-points of conductive lines 60, 61 acting as a first word line WLn and a second word line WLn+1 with a first stack of semiconductor material strips 51, 52, a second stack of semiconductor material strips 53, 54 and a third stack of semiconductor material strips 55, 56 acting as bit lines BLn, BLn+1 and BLn+2 in first and second layers of the array. The first plane of memory cells includes memory cells 30, 31 on semiconductor material strip 52, memory cells 32, 33 on semiconductor material strip 54, and memory cells 34, 35 on semiconductor material strip 56. The second plane of memory cells includes memory cells 40, 41 on semiconductor material strip 51, memory cells 42, 43 on semiconductor material strip 53, and memory cells 44, 45 on semiconductor material strip 55. As shown in the figure, the conductive line 60, acting as word line WLn, includes vertical extensions 60-1, 60-2, 60-3 which correspond with the material in the trench 20 shown in FIG. 1 between the stacks in order to couple the conductive line 60 to the memory cells along the 3 illustrated semiconductor material strips in each plane. An array having many layers can be implemented as described herein, enabling very high density memory approaching or reaching terabits per chip.

FIG. 5 is a perspective drawing of a 2×2 portion of a three-dimensional charge trapping memory array with fill material removed from the drawing to give a view of the stacks of semiconductor material strips and orthogonal conductive lines that make up the 3D array. In this illustration, only 2 layers are shown. However, the number of layers can be extended to very large numbers. As shown in FIG. 5, the memory array is formed on an integrated circuit substrate having an insulating layer 110 over underlying semiconductor or other structures (not shown). The memory array includes a plurality of stacks (2 are shown in the drawing) of semiconductor material strips 111, 112, 113, 114 separated by insulating material 121, 122, 123, 124. The stacks are ridge-shaped oriented along the Y-axis as illustrated in the figure, so that the semiconductor material strips 111-114 can be configured as bit lines, and extend out of the substrate. Semiconductor material strips 111 and 113 can act as bit lines in a first memory plane. Semiconductor material strips 112 and 114 can act as bit lines in a second memory plane.

The insulating material 121 between the semiconductor material strips 111 and 112 in a first stack and the insulating material 123 between semiconductor material strips 113 and 114 in the second stack has an effective oxide thickness of about 40 nm or greater, where effective oxide thickness EOT is a thickness of the insulating material normalized according to a ratio of the dielectric constant of silicon dioxide and the dielectric constant of the chosen insulation material. The term "about 40 nm" is used here to account for variations on the order of 10% or so, as arise typically in manufacturing structures of this type. The thickness of the insulating material can play a critical role in reducing interference between cells in adjacent layers of the structure. In some embodiments, the EOT of the insulating material can be as small as 30 nm while achieving sufficient isolation between the layers.

A layer 115 of memory material, such as a dielectric charge trapping structure, coats the plurality of stacks of semiconductor material strips in this example. A plurality of conductive lines 116, 117 is arranged orthogonally over the plurality of stacks of semiconductor material strips. The conductive lines 116, 117 have surfaces conformal with the plurality of stacks of semiconductor material strips, filling the trenches (e.g. 120) defined by the plurality of stacks, and defining a multi-layer array of interface regions at cross-points between side surfaces of the semiconductor material strips 111-114 on the stacks and conductive lines 116, 117. A layer of silicide (e.g. tungsten silicide, cobalt silicide, titanium silicide) 118, 119 can be formed over the top surfaces of the conductive lines 116, 117.

Nanowire MOSFET type cells can also be configured in this manner, by providing nanowire or nanotube structures in channel regions on conductive lines 111-114, like those described in Paul, et al., "Impact of a Process Variation on Nanowire and Nanotube Device Performance", IEEE Transactions on Electron Devices, Vol. 54, No. 9, September 2007, which article is incorporated by reference as if fully set forth herein.

As a result, a 3D array of SONOS-type memory cells configured in a NAND flash array can formed. The source, drain and channel are formed in the silicon (S) semiconductor material strips 111-114, the layer 115 of the memory material includes a tunneling dielectric layer 97 which can be formed of silicon oxide (O), a charge storage layer 98 which can be formed of silicon nitride (N), a blocking dielectric layer 99 which can be formed of silicon oxide (O), and the gate comprises polysilicon (S) of the conductive lines 116, 117.

The semiconductor material strips 111-114 can be a p-type semiconductor material. The conductive lines 116, 117 can be a semiconductor material with the same or a different conductivity type (e.g. p+-type). For example, the semiconductor material strips 111-114 can be made using p-type polysilicon, or p-type epitaxial single crystal silicon, while the conductive lines 116, 117 can be made using relatively heavily doped p+-type polysilicon.

Alternatively, the semiconductor material strips 111-114 can be n-type semiconductor material. The conductive lines 116, 117 can be a semiconductor material with the same or a different conductivity type (e.g. p+-type). This n-type strip arrangement results in buried-channel, depletion mode charge trapping memory cells. For example, the semiconductor material strips 111-114 can be made using n-type polysilicon, or n-type epitaxial single crystal silicon, while the conductive lines 116, 117 can be made using relatively heavily doped p+-type polysilicon. A typical doping concentration for n-type semiconductor material strips can be around $10^{18}/cm^3$, with usable embodiments likely in the range of $10^{17}/cm^3$ to $10^{19}/cm^3$. The use of n-type semiconductor material strips can be particularly beneficial in junction-free embodiments to improve conductivity along the NAND strings and thereby allowing higher read current.

Thus, memory cells comprising field effect transistors having charge storage structures are formed in the 3D array of cross-points. Using dimensions for the widths of the semiconductor material strips and conductive lines on the order of 25 nanometers, with gaps between the ridge-shaped stacks on the order of 25 nanometers, a device having a few tens of layers (e.g. 30 layers) can approach terabit capacity ($10^{12}$) in a single chip.

The layer 115 of memory material can comprise other charge storage structures. For example, a bandgap engineered SONOS (BE-SONOS) charge storage structure can be used which includes a dielectric tunneling layer 97 that includes a composite of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer of the layer 115 in this embodiment comprises silicon dioxide on the side surface of the semiconductor material strips formed for example using in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

The band offset layer in this embodiment comprises silicon nitride lying on the hole tunneling layer, formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The band offset layer thickness of silicon nitride is less than 30 Å, and preferably 25 Å or less.

The isolation layer in this embodiment comprises silicon dioxide, lying on the band offset layer of silicon nitride formed for example using LPCVD high temperature oxide HTO deposition. The thickness of the isolation layer of silicon dioxide is less than 35 Å, and preferably 25 Å or less. This three-layer tunneling layer results in an inverted U-shaped valence band energy level.

The valence band energy level at the first location is such that an electric field sufficient to induce hole tunneling through the thin region between the interface with the semiconductor body (or semiconductor material strip) and the first location, is also sufficient to raise the valence band energy level after the first location to a level that effectively eliminates the hole tunneling barrier in the composite tunneling dielectric after the first location. This structure establishes an inverted U-shaped valence band energy level in the three-layer tunneling dielectric layer, and enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

In a representative device, the layer 115 of memory material includes a bandgap engineered composite tunneling dielectric layer comprising a layer of silicon dioxide less than 2 nm thick, a layer of silicon nitride less than 3 nm thick, and a layer of silicon dioxide less that 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body or semiconductor material strip. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

A charge trapping layer in the layer 115 of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer 115 of memory material in this embodiment comprises a layer of silicon dioxide having a thickness greater than 50 Å, including for example about 90 Å in this embodiment, can be formed by wet conversion from the nitride by a wet furnace oxidation process. Other embodiments may be implemented using high temperature oxide (HTO) or LPCVD $SiO_2$. Other blocking dielectrics can include high-K materials like aluminum oxide.

In a representative embodiment, the hole tunneling layer can be 13 Å of silicon dioxide; the band offset layer can be 20 Å of silicon nitride; the isolation layer can be 25 Å of silicon dioxide; the charge trapping layer can be 70 Å of silicon nitride; and the blocking dielectric layer can be silicon oxide 90 Å thick. The gate material is the p+ polysilicon (work function about 5.1 eV) used in the conductive lines 116, 117.

FIG. 6 shows a cross-section view cut in the X-Z plane of the charge trapping memory cell formed at the intersection of conductive line 116 and semiconductor material strip 114. Active charge trapping regions 125, 126 are formed on the both sides of the strip 114 between the conductive lines 116 and the strip 114. In the embodiment described here, as shown in FIG. 6, each memory cell is a double gate field effect transistor having active charge storage regions 125, 126, one on each side of the semiconductor material strip 114.

FIG. 7 shows a cross-section view cut in the X-Y plane of the charge trapping memory cell formed at the intersection of the conductive lines and 116, 117 and the semiconductor material strip 114. The current path down the semiconductor material strip 114 is illustrated. Electron current as illustrated by the dashed arrows in the diagram flows along the p-type semiconductor material strips, to sense amplifiers where it can be measured to indicate the state of a selected memory cell. The source/drain regions 128, 129, 130 between the conductive lines 116, 117 which act as word lines can be "junction-free", without source and drain doping having a conductivity type opposite that of the channel regions beneath the word lines. In the junction free embodiment, the charge trapping field effect transistors can have a p-type channel structure. Also, source and drain doping could be implemented in some embodiments, in a self-aligned implant after word line definition.

In alternative embodiments, the semiconductor material strips 111-114 can be implemented using a lightly doped n-type semiconductor body in junction free arrangements, resulting in a buried-channel field effect transistor which can operate in depletion mode, with naturally shifted lower threshold distributions for the charge trapping cells.

Figure 8:
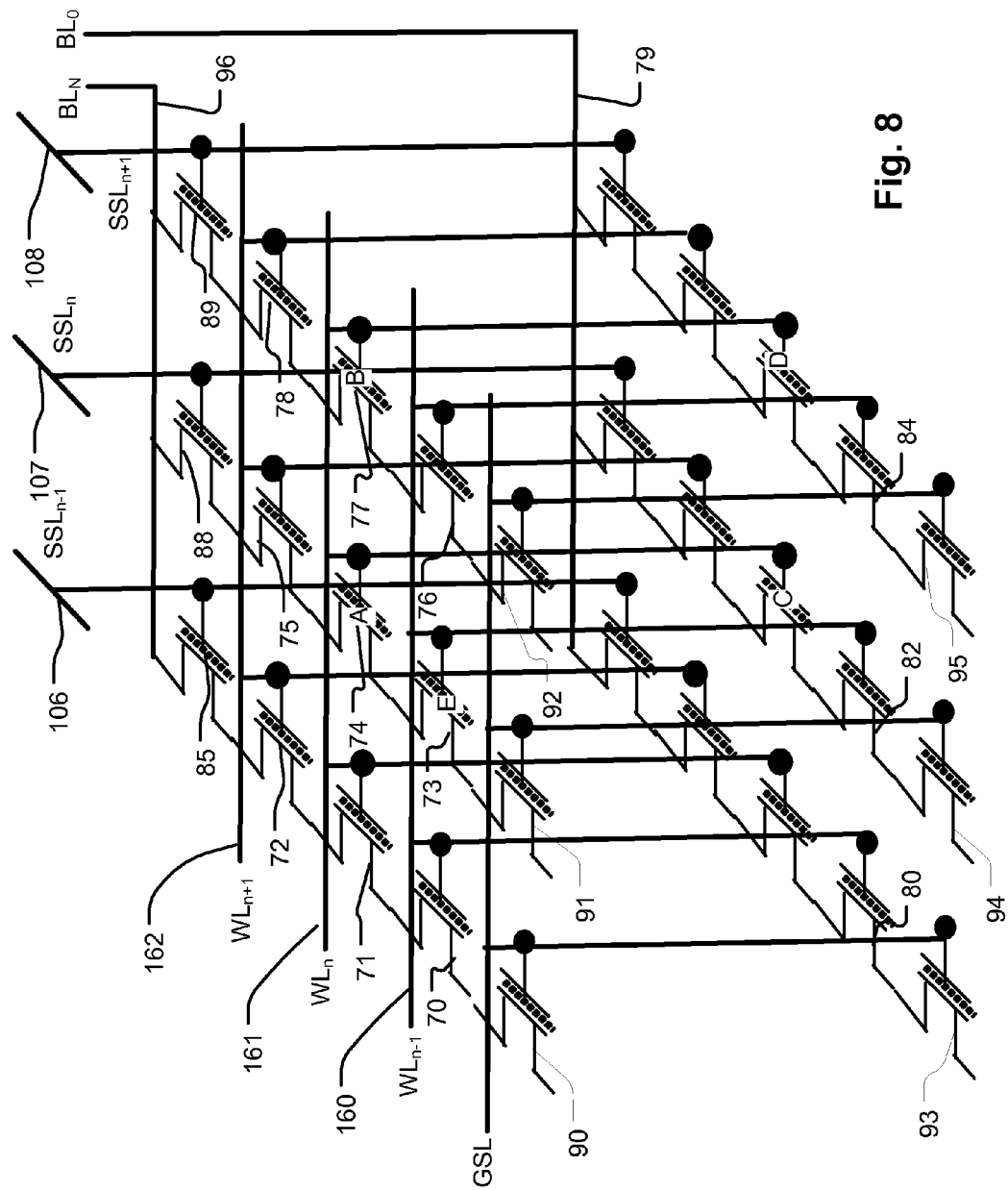
FIG. 8 is a schematic diagram of NAND flash memory having the structure of FIG. 5 and FIG. 23.

FIG. 8 is a schematic diagram showing 2 planes of memory cells having 9 charge trapping cells arranged in a NAND configuration, which is representative of a cube which can include many planes and many word lines. The 2 planes of memory cells are defined at the cross-points of conductive lines 160, 161, 162 acting as a word line WLn−1, word line WLn, and word line WLn+1, with a first stack of semiconductor material strips, a second stack of semiconductor material strips and a third stack of semiconductor material strips.

The first plane of memory cells includes memory cells 70, 71, 72 in a NAND string on a semiconductor material strip, memory cells 73, 74, 75 in a NAND string on a semiconductor material strip, and memory cells 76, 77, 78 in a NAND string on a semiconductor material strip. The second plane of memory cells corresponds with a bottom plane in the cube in this example, and includes memory cells (e.g. 80, 82, 84) arranged in NAND strings in a manner similar to those in the first plane.

As shown in the figure, the conductive line 160 acting as word line WLn includes vertical extensions which correspond with the material in the trench 120 shown in FIG. 5 between the stacks, in order to couple the conductive line 160 to the memory cells (cells 70, 73, 76 in the first plane) in the interface regions in the trenches between the semiconductor material strips in all of the planes.

String select transistors 85, 88, and 89 are connected between respective NAND strings and a bit line $BL_N$ 96 in this arrangement. Likewise, similar string select transistors on a bottom plane in the cube are connected between respective NAND strings and a bit line $BL_0$ 79 in this arrangement. String select lines 106, 107 and 108, are connected in a column between the ridges to the gates of string select transistors in each plane of the cube, and provide in this example string select signals $SSL_{n-1}$, $SSL_n$ and $SSL_{n+1}$.

Figure 23:
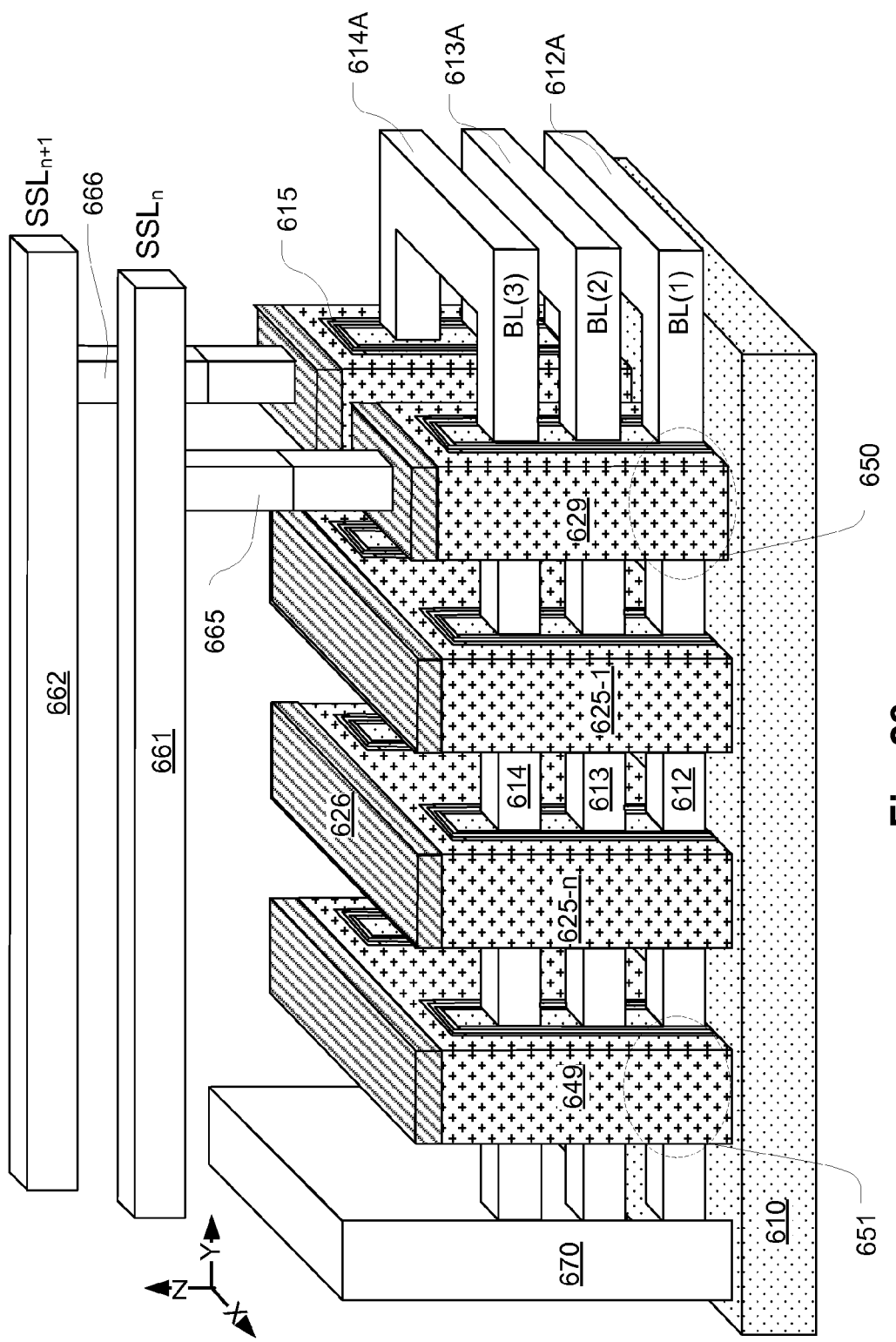
FIG. 23 is a perspective illustration showing string select structures for a NAND flash based memory, including a common source line.

Block select transistors 90-95 are arranged at the opposite ends of the NAND strings and are used to couple the NAND strings in a selected cube to a reference source such as ground (example shown in FIG. 23). The ground select signal GSL in this example is coupled to the gates of the block select transistors 90-95, and can be implemented in the same manner as the conductive lines 160, 161 and 162. The string select transistors and block select transistors can use the same dielectric stack as a gate oxide as the memory cells in some embodiments. In other embodiments, a typical gate oxide, without memory material, is used instead. Also, the channel lengths and widths can be adjusted as suits the designer to provide the switching function for the transistors.

FIG. 9 is a perspective drawing of an alternative structure like that of FIG. 5. The reference numerals of similar structures are reused in the figure, and not described again. FIG. 9 differs from FIG. 5 in that the surface 110A of the insulating layer 110, and the side surfaces 113A, 114A of the semiconductor material strips 113, 114 are exposed between the conductive lines (such as 116) which act as word lines, as a result of the etch process which forms the word lines. Thus, the layer 115 of memory material can be completely or partially etched between the word lines without harming operation. However, there is no necessity in some structures for etching through the memory layer 115 forming the dielectric charge trapping structures like those described here.

FIG. 10 is a cross-section of a memory cell in the X-Z plane like that of FIG. 6. FIG. 10 is identical to FIG. 6, illustrating that a structure like that of FIG. 9 results in memory cells that are the same as those implemented in the structure of FIG. 5 in this cross-section. FIG. 11 is a cross-section section of a memory cell in the X-Y plane like that of FIG. 7. FIG. 11 differs from FIG. 7 in that the regions 128a, 129a and 130a along the side surfaces (e.g. 114A) of the semiconductor material strip 114 may have the memory material removed.

Active charge trapping regions 125, 126 are formed on the both sides of the strip 114 between the conductive lines 116 and the strip 114.

Figure 12:
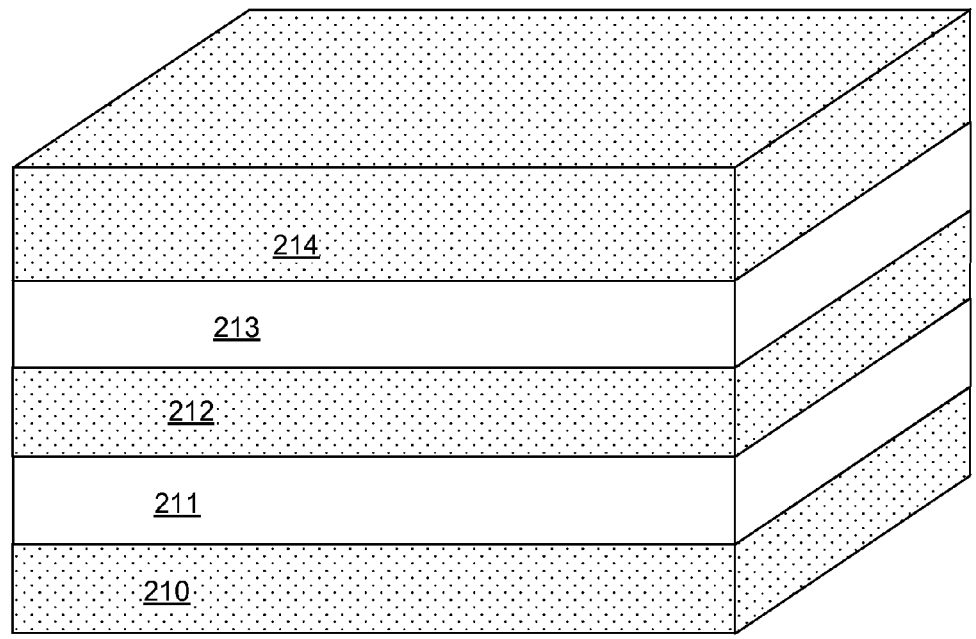
FIG. 12 illustrates a first stage in a process for manufacturing a memory device like that of FIGS. 1, 5 and 9.

FIGS. 12-16 illustrate stages in a basic process flow for implementing 3D memory arrays as described above utilizing only 2 pattern masking steps that are critical alignment steps for array formation. In FIG. 12, a structure is shown which results from alternating deposition of insulating layers 210, 212, 214 and semiconductor layers 211, 213 formed using doped semiconductors for example in a blanket deposition in the array area of a chip. Depending on the implementation, the semiconductor layers 211, 213 can be implemented using polysilicon or epitaxial single crystal silicon having n-type or p-type doping. Inter-level insulating layers 210, 212, 214 can be implemented for example using silicon dioxide, other silicon oxides, or silicon nitride. These layers can be formed in a variety of ways, including low pressure chemical vapor deposition LPCVD processes available in the art.

Figure 13:
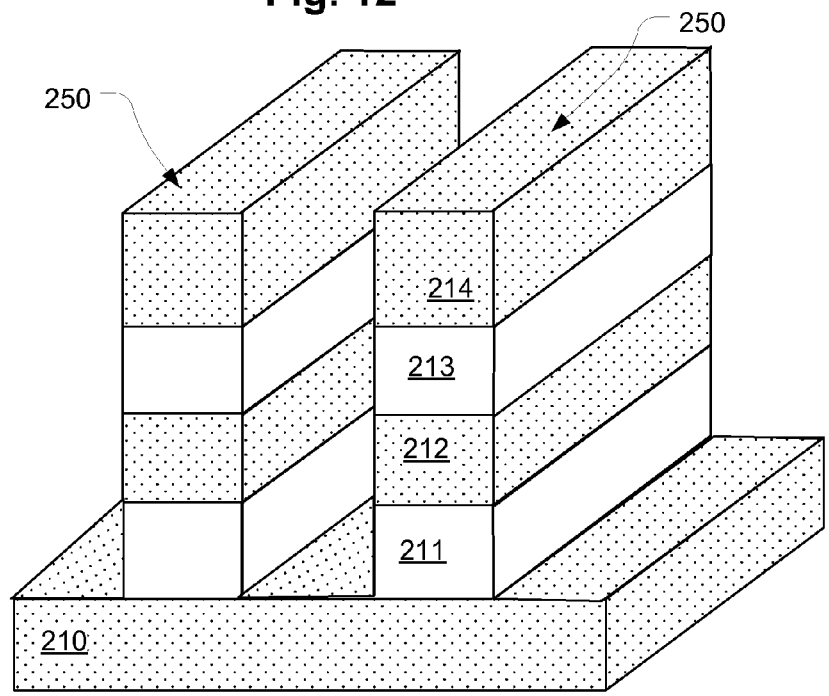
FIG. 13 illustrates a second stage in a process for manufacturing a memory device like that of FIGS. 1, 5 and 9.

FIG. 13 shows the result of a first lithographic patterning step used to define a plurality of ridge-shaped stacks 250 of semiconductor material strips, where the semiconductor material strips are implemented using the material of the semiconductor layers 211, 213, and separated by the insulating layers 212, 214. Deep, high aspect ratio trenches can be formed in the stack, supporting many layers, using lithography based processes applying a carbon hard mask and reactive ion etching.

Figure 14A:
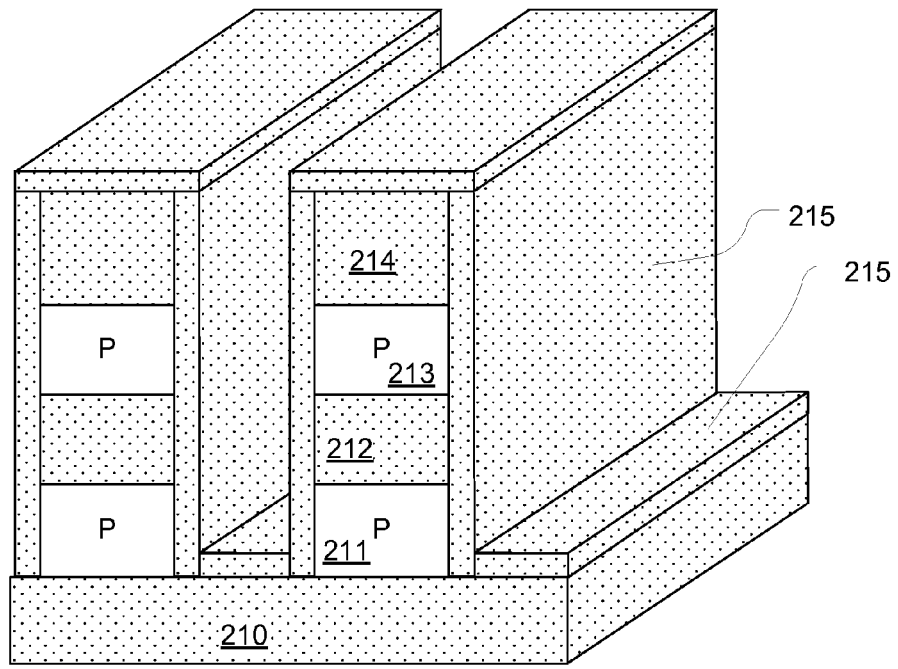
FIG. 14A illustrates a third stage in a process for manufacturing a memory device like that of FIG. 1.
Figure 14B:
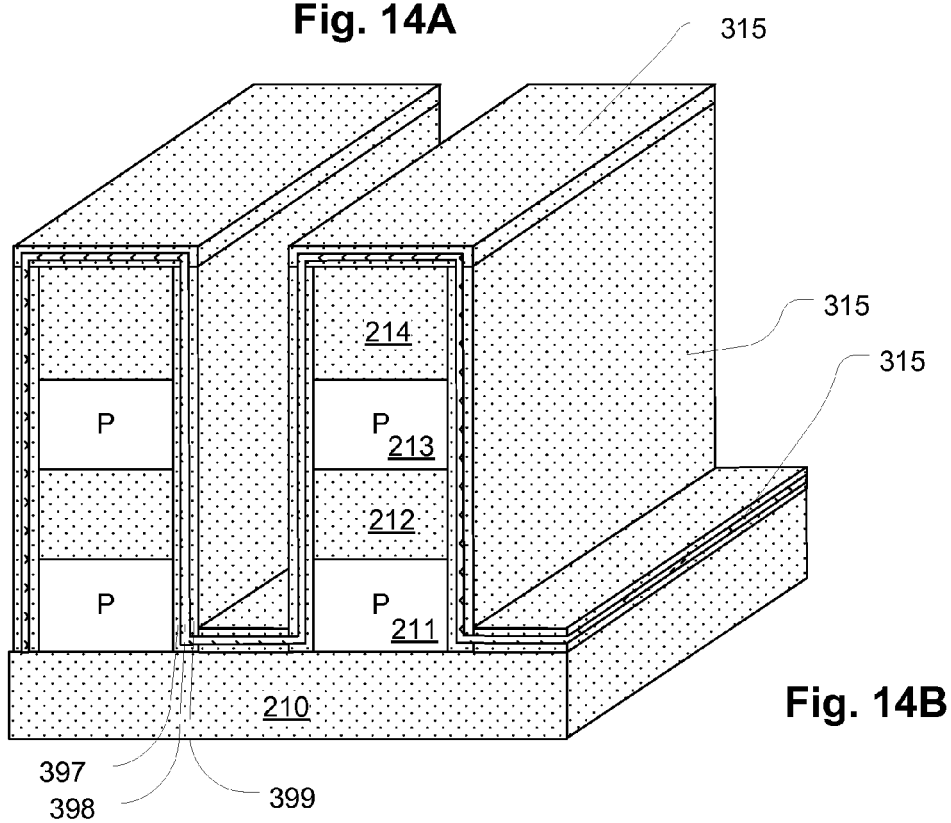
FIG. 14B illustrates a third stage in a process for manufacturing a memory device like that of FIG. 5.

FIGS. 14A and 14B show the next stage for, respectively, an embodiment including a programmable resistance memory structure such as an anti-fuse cell structure, and an embodiment including a programmable charge trapping memory structure such as a SONOS type memory cell structure.

FIG. 14A shows results of a blanket deposition of a layer 215 of memory material in an embodiment in which the memory material consists of a single layer as in the case of an anti-fuse structure like that shown in FIG. 1. In an alternative, rather than a blanket deposition, an oxidation process can be applied to form oxides on the exposed sides of the semiconductor material strips, where the oxides act as the memory material.

Figure 15:
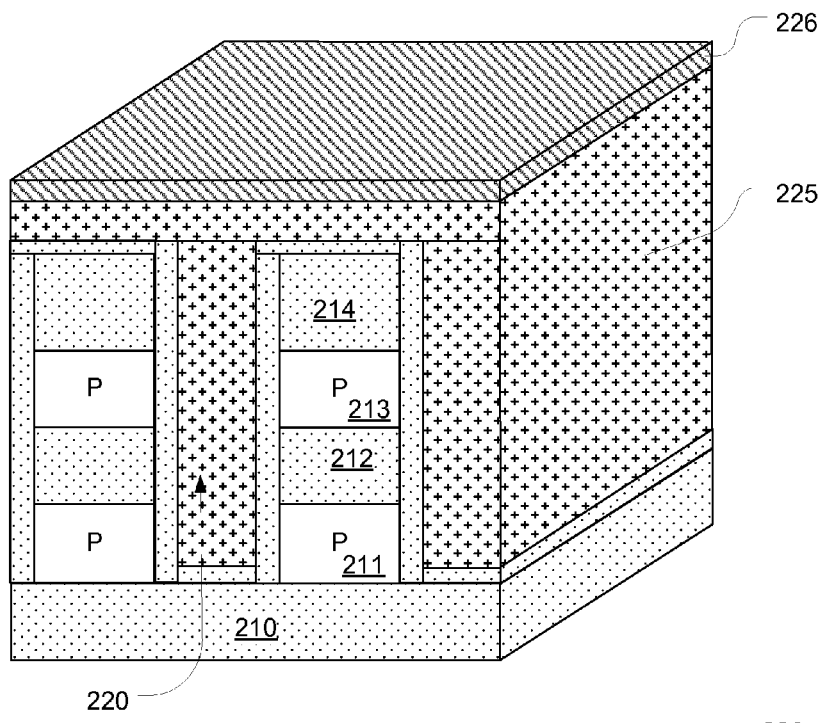
FIG. 15 illustrates a third stage in a process for manufacturing a memory device like that of FIGS. 1, 5 and 9.

FIG. 14B shows results of blanket deposition of a layer 315 that comprises multilayer charge trapping structure including a tunneling layer 397, a charge trapping layer 398 and a blocking layer 399 as described above in connection with FIG. 4. As shown in FIGS. 14A and 14B, the memory layers 215, 315 are deposited in a conformal manner over the ridge-shaped stacks (250 of FIG. 13) of semiconductor material strips. FIG. 15 shows the results of a high aspect ratio fill step in which conductive material, such as polysilicon having n-type or p-type doping, to be used for the conductive lines which act as word lines, is deposited to form layer 225. Also, a layer of silicide 226 can be formed over the layer 225 in embodiments in which polysilicon is utilized. As illustrated in the figure, high aspect ratio deposition technologies such as low-pressure chemical vapor deposition of polysilicon in the illustrated embodiments is utilized to completely fill the trenches 220 between the ridge-shaped stacks, even very narrow trenches on the order of 10 nanometers wide with high aspect ratio.

Figure 16:
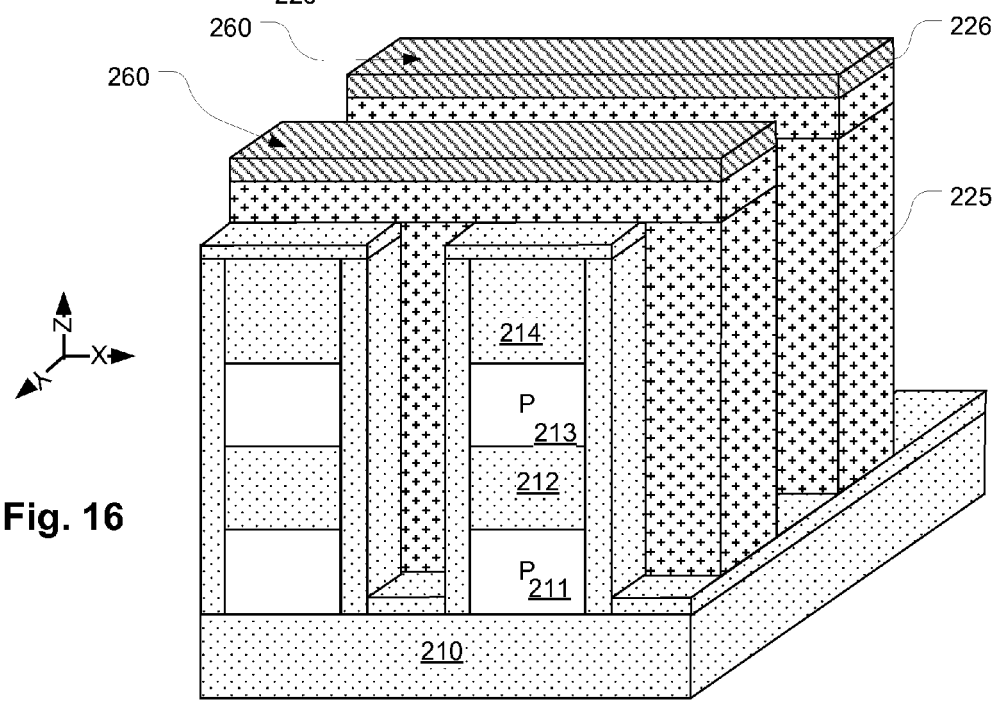
FIG. 16 illustrates a fourth stage in a process for manufacturing a memory device like that of FIGS. 1, 5 and 9.

FIG. 16 shows results of the second lithographic patterning step used to define a plurality of conductive lines 260 which act as word lines for the 3D memory array. The second lithographic patterning step utilizes a single mask for critical dimensions of the array for etching high aspect ratio trenches between the conductive lines, without etching through the ridge-shaped stacks. Polysilicon can be etched using an etch process that is highly selective for polysilicon over silicon oxides or silicon nitrides. Thus, alternating etch processes are used, relying on the same mask to etch through the semiconductor and insulating layers, with the process stopping on the underlying insulating layer 210.

Figure 17:
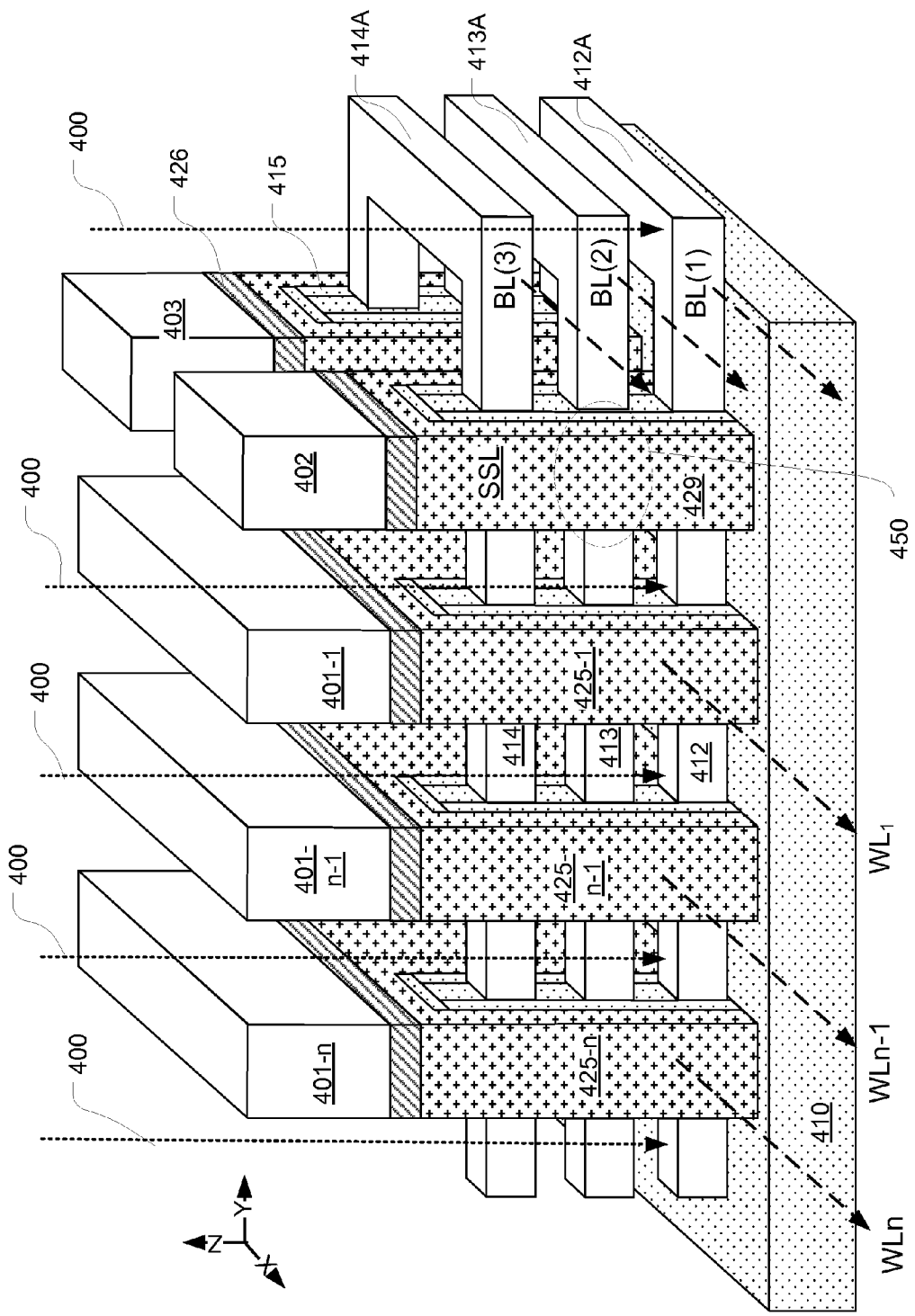
FIG. 17 illustrates string select structures from a perspective rotated 90 degrees on the Z-axis, also showing a fifth stage in a process for manufacturing a memory device like that of FIG. 1, including a hard mask and an optional implant step.

FIG. 17 is a perspective view showing the manner in which the semiconductor material strips are connected together in one decoding structure, and illustrating an optional implant step. The perspective in FIG. 17 is rotated 90 degrees on the Z-axis, so that the Y- and Z-axes lie in the plane of the paper, as compared to the orientation of FIG. 1 and FIG. 16 in which the X- and Z-axes lie in the plane of the paper.

Also, the insulating layers between the semiconductor strips, in the ridge-shaped stacks are removed from the drawing to expose additional structure.

The multilayer array is formed on an insulating layer 410, and includes a plurality of conductive lines 425-1, . . . , 425-$n$-1, 425-$n$ conformal with the plurality of ridge-shaped stacks, and which act as word lines WLn, WLn−1, . . . WL1. The plurality of ridge-shaped stacks includes semiconductor strips 412, 413, 414, which are coupled to the semiconductor strips in the same plane in parallel ridge-shaped stacks by extensions 412A, 413A, 414A. In another embodiment shown later, the extensions form a staircase structure terminating the strips. These extensions 412A, 413A, 414A of the semiconductor strips are oriented along the X-axis direction, coupled to the plurality of ridge-shaped stacks of semiconductor material strips. Also, as illustrated below, these extensions 412A, 413A, 414A extend beyond the edge of the array, and are arranged for connection to decoding circuitry to select planes within the array. These extensions 412A, 413A, 414A can be patterned at the same time that the plurality of ridge-shaped stacks are defined, or before. In the embodiment shown later, with the extensions that form a staircase structure terminating the strips, it is unnecessary for the extensions to extend beyond the edge of the array.

A layer of memory material 415 separates the conductive lines 425-1 through 425-$n$, from the semiconductor material strips 412-414 as described in detail above.

Transistors, e.g. transistor 450, are formed between the semiconductor strips 412, 413, 414 and the conductive line 425-1. In the transistors, the semiconductor strip (e.g. 413) acts as the channel region of the device. Gate structures (e.g. 429) are patterned during the same step that the conductive lines 425-1 through 425-$n$ are defined. A layer of silicide 426 can be formed along the top surface of the conductive lines, and over the gate structures 429. The layer of memory material 415 can act as the gate dielectric for the transistors. These transistors act as select gates coupled to decoding circuitry for selecting columns along the ridge-shaped stacks in the array.

An optional manufacturing step includes forming hard masks 401-1 through 401-$n$ over the plurality of conductive lines, and hard masks 402 and 403 over the gate structures 429. The hard masks can be formed using a relatively thick layer of silicon nitride or other material which can block ion implantation processes. After the hard masks are formed, an implant 400 can be applied to increase the doping concentration in the semiconductor strips 412-414, and in the extensions 412A-414A, and thereby reduce the resistance of the current path along the semiconductor strips. By utilizing controlled implant energies, the implants can be caused to penetrate to the bottom semiconductor strip 412, and each overlying semiconductor strip in the stacks.

Figure 18:
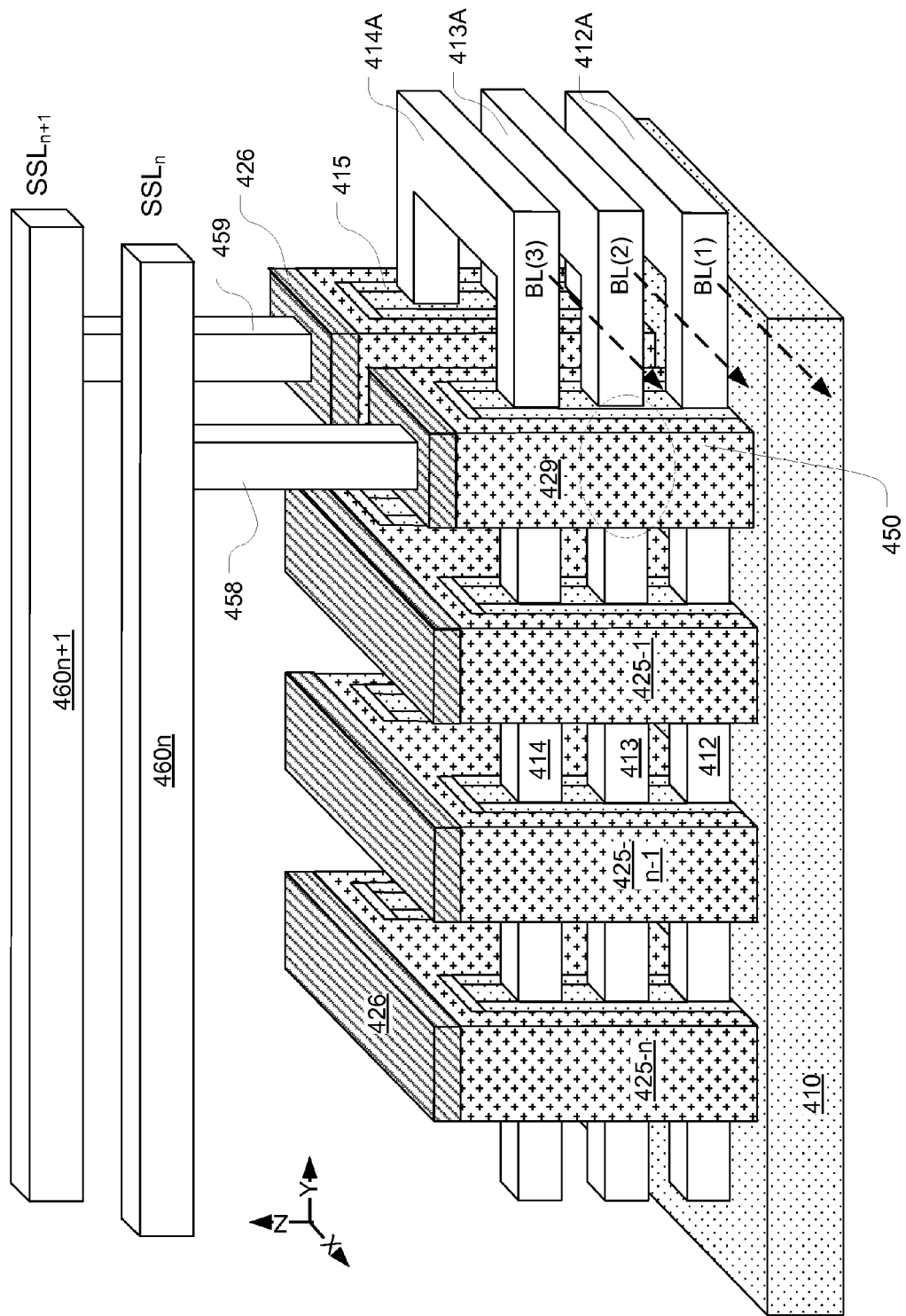
FIG. 18 is a perspective illustration showing string select structures for an anti-fuse based memory.

FIG. 18 shows a following stage in a process for manufacturing a memory array shown in FIG. 17. Like reference numerals are utilized in this figure, and not described again. The structure shown in FIG. 18 shows results of removing the hard masks, exposing the silicide layers 426 along the top surfaces of the conductive lines 425-1 through 425-n, and over the gate structures 429. After an interlayer dielectric (not shown) is formed over the top of the array, vias are opened in which contact plugs 458, 459 using tungsten fill for example, are formed reaching to the top surfaces of the gate structures 429. Overlying metal lines 460n, 460n+1 are patterned to connect as SSL lines, to column decoder circuits. A three-plane decoding network is established in the illustrated manner, accessing a selected cell using one word line, one bit line and one SSL line. See, U.S. Pat. No. 6,906,940, entitled Plane Decoding Method and Device for Three Dimensional Memories.

To program a selected anti-fuse type cell, in this embodiment the selected word line can be biased with −7 Volts, the unselected word lines can be set at 0 Volts, the selected bit line can be set at 0 Volts, the unselected bit lines can be set at 0 Volts, the selected SSL line can be set at −3.3 volts, and the unselected SSL lines can be set at 0 Volts. To read a selected cell, in this embodiment the selected word line can be biased with −1.5 Volts, the unselected word lines can be set at 0 Volts, the selected bit line can be set at 0 Volts, the unselected bit lines can be set at 0 Volts, the selected SSL line can be set at −3.3 volts, and the unselected SSL lines can be set at 0 Volts.

Figure 19:
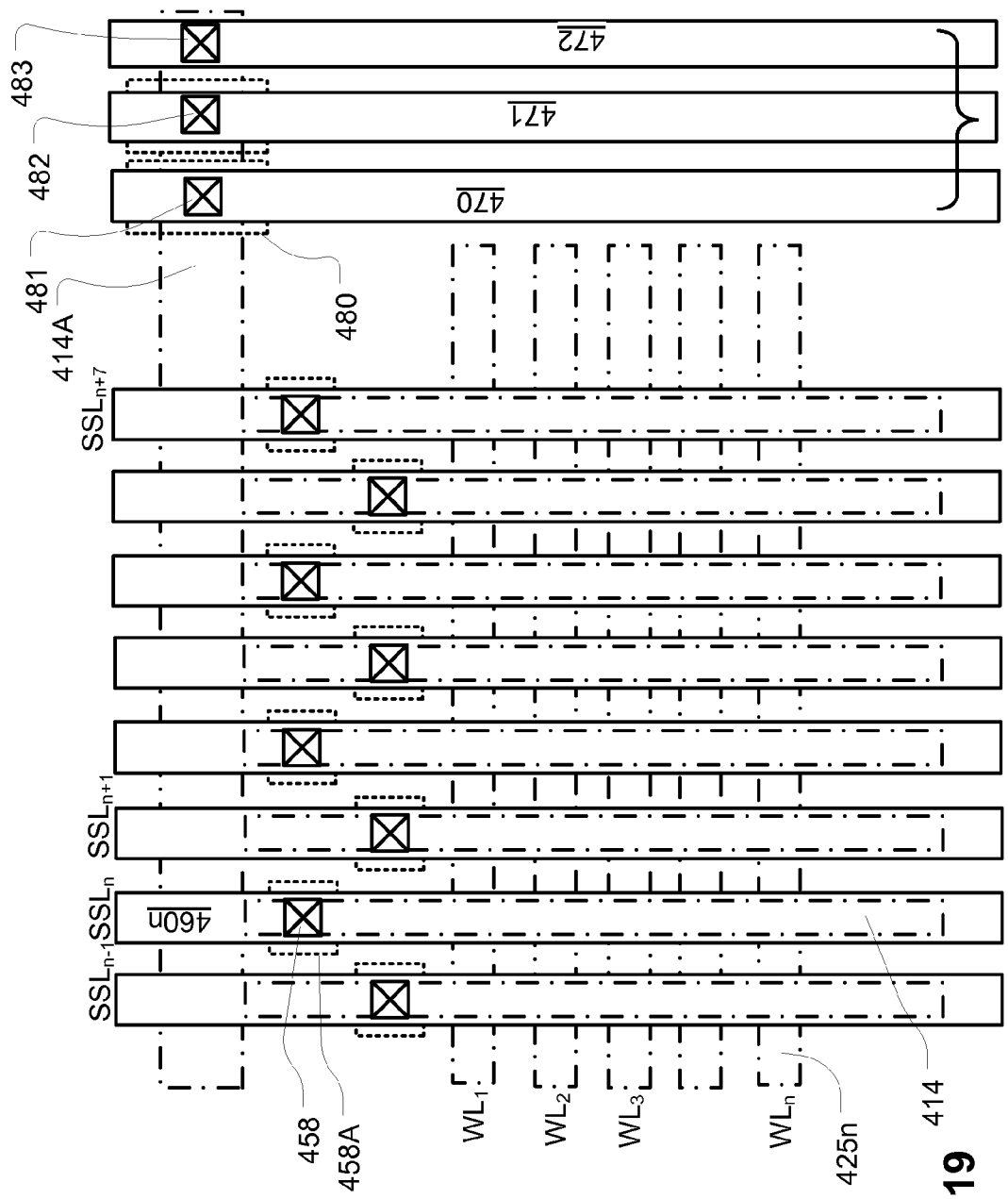
FIG. 19 is a layout view for a device like that of FIG. 18, showing interconnections to plane decoding structures.

FIG. 19 provides a layout view showing the layout of the SSL lines and bit lines 470-472, which overlie the ridge-shaped stacks, including semiconductor material strips 414, and the conductive lines 425n which act as word lines. The word lines extend to row decoder circuits.

As shown in the figure, contact plugs (e.g. 458) connect to the gate structures for selecting semiconductor material strips 414 to overlying SSL lines (e.g. 460n). A so-called twisted layout can be utilized, where the gate structures are staggered in the manner shown in the drawing so that the alignment margins (e.g. 458A) for the process of patterning the conductive contact plugs 458 can be shared along multiple rows of contacts reducing the average pitch of the layout of the ridge-shaped stacks. The SSL lines extend to column decoder circuits.

FIG. 19 also illustrates the layout of the connection of the extensions (e.g. 414A) of the semiconductor material strips to bit lines. As shown, the extensions 414A extend outside of the array to a bit line area. Vias are opened in a staggered manner exposing an extension of a semiconductor material strip in each plane of the array. In this example, a contact 481 is made to a semiconductor material strip in a first plane. Contact 482 is made to the semiconductor material strip in a second plane. Contact 483 is made to a semiconductor material strip in a third plane, and so on. Noncritical alignment can be utilized for the formation of these contacts, with relatively broad tolerance as shown at 480. Bit lines 470, 471, 472 connected to the contacts 481, 482, 483 extend parallel to the SSL lines to plane decoder circuits and sense amplifiers. In the embodiment shown later, with the extensions that form a staircase structure terminating the strips, it is unnecessary for the extensions to extend beyond the edge of the array.

Figure 20:
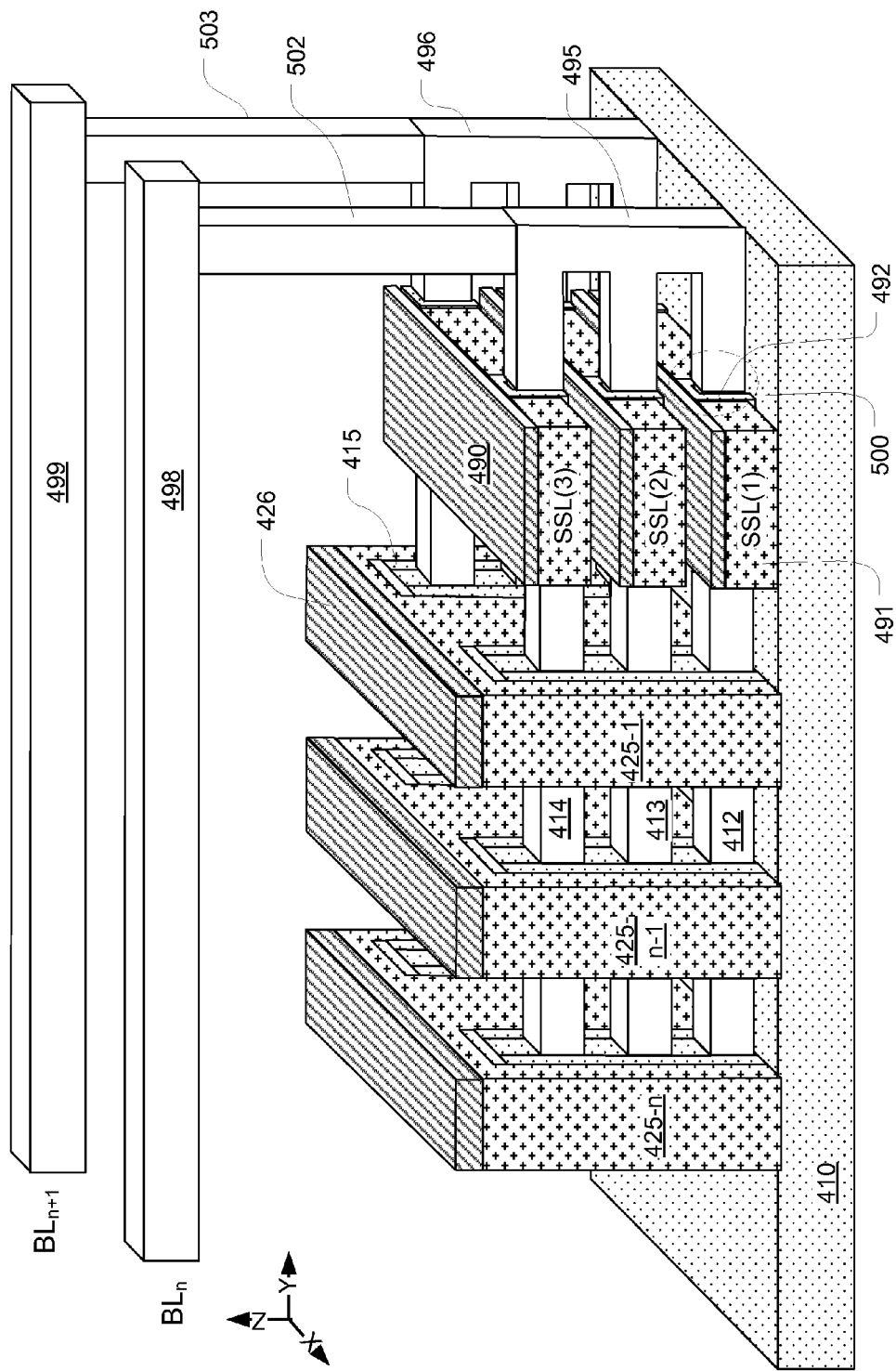
FIG. 20 is a perspective illustration showing an alternative decoding structure for an anti-fuse based memory.

FIG. 20 illustrates a perspective view, with the Y-and Z-axes in the plane of the paper, of a different decoding layout compared to that of FIG. 18. In the embodiment of FIG. 20, an additional patterning process is used to define SSL lines (e.g. 491) using polysilicon for example, in each plane of the array layout in lines parallel to the conductive lines (e.g. 425-1). Transistors 500 are formed, using the semiconductor material strips (e.g. 412) as the channel regions. A layer 492 of gate dielectric is applied between the SSL lines 491 and the semiconductor material strips 412. Silicide 490 can be applied over the SSL lines 491. The SSL lines 491 extend outwardly from the array for connection to decoding circuitry as discussed below. Overlying bit lines 498 and 499 are coupled to the semiconductor material strips 412, 413, 414 in respective ridge-shaped stacks, by opening vias through the structure, and forming contact structures 495, 502, 496, 503 within the vias.

Figure 21:
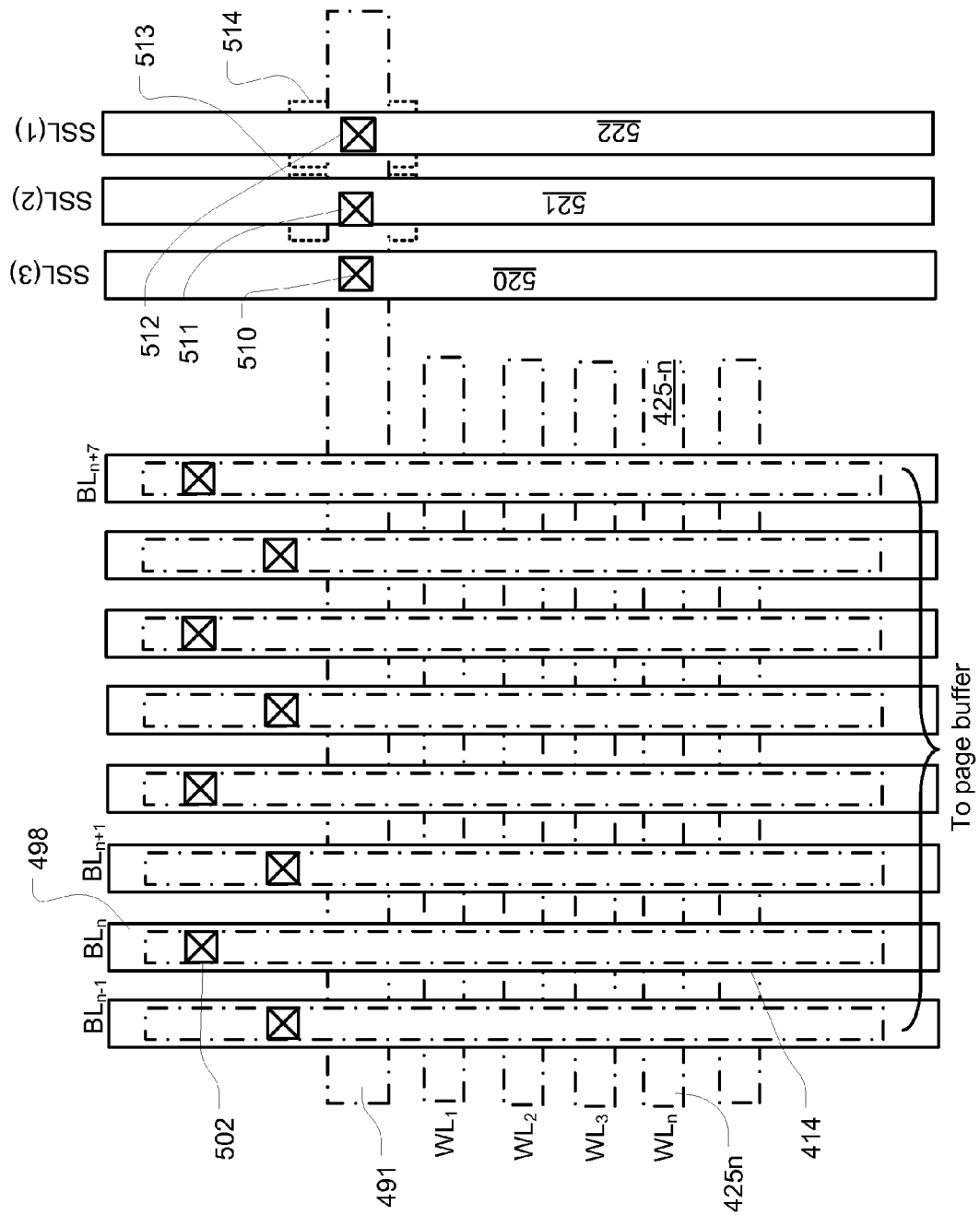
FIG. 21 is a layout view for a device like that of FIG. 20.

FIG. 21 illustrates a layout view for the decoding scheme of FIG. 20. As shown, contacts (e.g. 502) can be formed between the semiconductor material strips (e.g. 414) and the bit lines (e.g. 498). The contacts can be arranged in a staggered fashion so that the alignment margin is shared among the plurality of columns.

The SSL lines (e.g. 491) extend outward from the array to a region where overlying global SSL lines 520, 521, 522 are arranged. Contact plugs 510, 511, 512 are formed in vias which extend to SSL lines in respective planes of the array. Again, noncritical alignment margins (e.g. 513, 514) can be applied during the layout of this structure. In this example, the SSL lines extend to plane decoder circuitry. The bit lines extend to column decoder circuitry and sense amplifiers, which can be arranged in a page buffer structure allowing for wide, parallel read and write operations. The word lines extend to row decoder circuitry.

Figure 22:
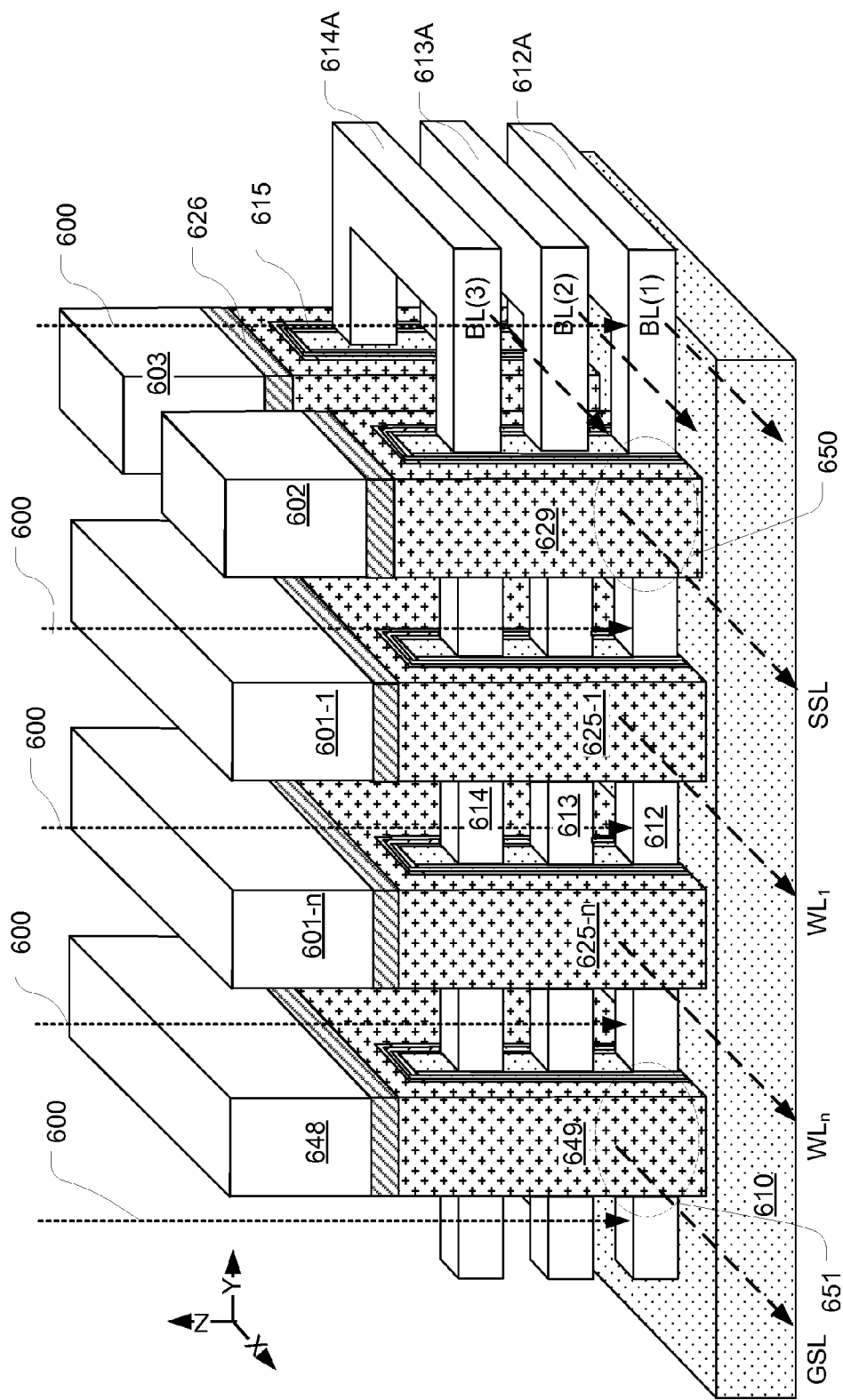
FIG. 22 illustrates string select structures from a perspective rotated 90 degrees on the Z-axis relative to FIG. 5, also showing a fifth stage in a process for manufacturing a memory device like that of FIG. 5, including a hard mask and an optional implant step.

FIG. 22 is a perspective view of a NAND flash array, showing the manner in which the semiconductor material strips are connected together in one decoding structure, and illustrating hard masks and an optional implant step. The perspective in FIG. 22 is rotated so that the Y- and Z-axes lie in the plane of the paper, as compared to the orientation of FIG. 5 in which the X- and Z-axes lie in the plane of the paper.

Also, the insulating layers between the semiconductor material strips, in the ridge-shaped stacks are removed from the drawing to expose additional structure.

The multilayer array is formed on an insulating layer 610, and includes a plurality of conductive lines 625-1, . . . , 625-n conformal with the plurality of ridge-shaped stacks, and which act as word lines WLn, WLn−1, . . . WL1. The plurality of ridge-shaped stacks includes semiconductor material strips 612, 613, 614, which are coupled to the semiconductor material strips in the same plane in parallel ridge-shaped stacks by extensions 612A, 613A, 614A. These extensions 612A, 613A, 614A of the semiconductor material strips are oriented along the X-axis direction, coupled to the plurality of ridge-shaped stacks of semiconductor material strips. Also, as illustrated below, these extensions 612A, 613A, 614A extend beyond the edge of the array, and are arranged for connection to decoding circuitry to select planes within the array. These extensions 612A, 613A, 614A can be patterned at the same time that the plurality of ridge-shaped stacks are defined, or previously when the alternating layers of semiconductor material and insulator material are formed.

In some embodiments, the extensions 612A, 613A, 614A form a staircase structure that terminates the semiconductor material strips 612, 613, 614. These extensions 612A, 613A, 614A can be patterned at the same time that the plurality of ridge-shaped stacks are defined.

A layer of memory material 615, which includes a multilayer charge trapping structure, separates the conductive lines 625-1 through 625-n, from the semiconductor material strips 612-614 as described in detail above.

Transistors, e.g. transistor 650, are formed between the extensions 612A, 613A, 614A and the conductive line 625-1. Also, transistors, e.g. transistor 651, are formed at opposite ends of the semiconductor material strips for controlling connection of sectors of the array to a common source line (not shown). In the transistors 650, 651, the semiconductor material strip (e.g. 612) acts as the channel region of the device.

Gate structures (e.g. 629, 649) are patterned during the same step in which the conductive lines 625-1 through 625-n are defined. The GSL select line 649 can be oriented along a row, across a plurality of the ridge-shaped stacks of semiconductor material strips. A layer of silicide 626 can be formed along the top surface of the conductive lines, and over the gate structures 629, 649. The layer of memory material 615 can act as the gate dielectric for the transistors. These transistors 650, 651 act as select gates coupled to decoding circuitry for selecting sectors and columns along the ridge-shaped stacks in the array.

An optional manufacturing step includes forming hard masks 601-1 through 601-n over the plurality of conductive lines, hard mask 648 over GSL select line 649 and hard masks 602 and 603 over the gate structures 629. The hard masks can be formed using relatively thick layers of silicon nitride or other material which can block ion implantation processes. After the hard masks are formed, an implant 600 of n-type or p-type dopants, depending on the implementation chosen, can be applied to increase the doping concentration in the semiconductor material strips 612-614, and in the extensions 612A-614A, and thereby reduce the resistance of the current path along the semiconductor material strips. Also, dopants having a conductivity type opposite that of the bulk semiconductor material strip (e.g. n-type implants, assuming a p-type semiconductor material strip) can be applied to form doped source/drain junctions along the semiconductor material strips if desired. By utilizing controlled implant energies, the implants can be caused to penetrate to the bottom semiconductor material strip 612, and each overlying semiconductor material strip in the stacks.

To program a selected NAND flash SONOS-type cell, in this embodiment, the selected word line can be biased with +20 Volts, the unselected word lines can be set at +10 Volts, the selected bit line can be set at 0 Volts, the unselected bit lines can be set at 0 Volts, the selected SSL line can be set at 3.3 volts, and the unselected SSL lines and the GSL line can be set at 0 Volts. To read a selected cell, in this embodiment, the selected word line can be biased with a read reference voltage, the unselected word lines can be set at 6 Volts, the selected bit line can be set at 1 Volt, the unselected bit lines can be set at 0 Volts, the selected SSL line can be set at 3.3 volts, and the unselected SSL lines can be set at 0 Volts.

FIG. 23 shows a following stage in a process for manufacturing a memory array shown in part in FIG. 22. Like reference numerals are utilized in this figure, and not described again. The structure shown in FIG. 23 shows results of removing the hard masks, exposing the silicide layers 626 along the top surfaces of the conductive lines 625-1 through 625-n, and over the gate structures 629 and 649. After an interlayer dielectric (not shown) is formed over the top of the array, vias are opened in which contact plugs 665, 666 using tungsten fill for example, are formed reaching to the top surfaces of the gate structures 629. Also a metal common source line 670 is formed in contact with the ends of the semiconductor material strips adjacent to the select transistors 651. Overlying metal lines 661 and 662 are patterned to connect via the contact plugs 665, 666 to SSL gates, and to column decoder circuits.

Figure 24:
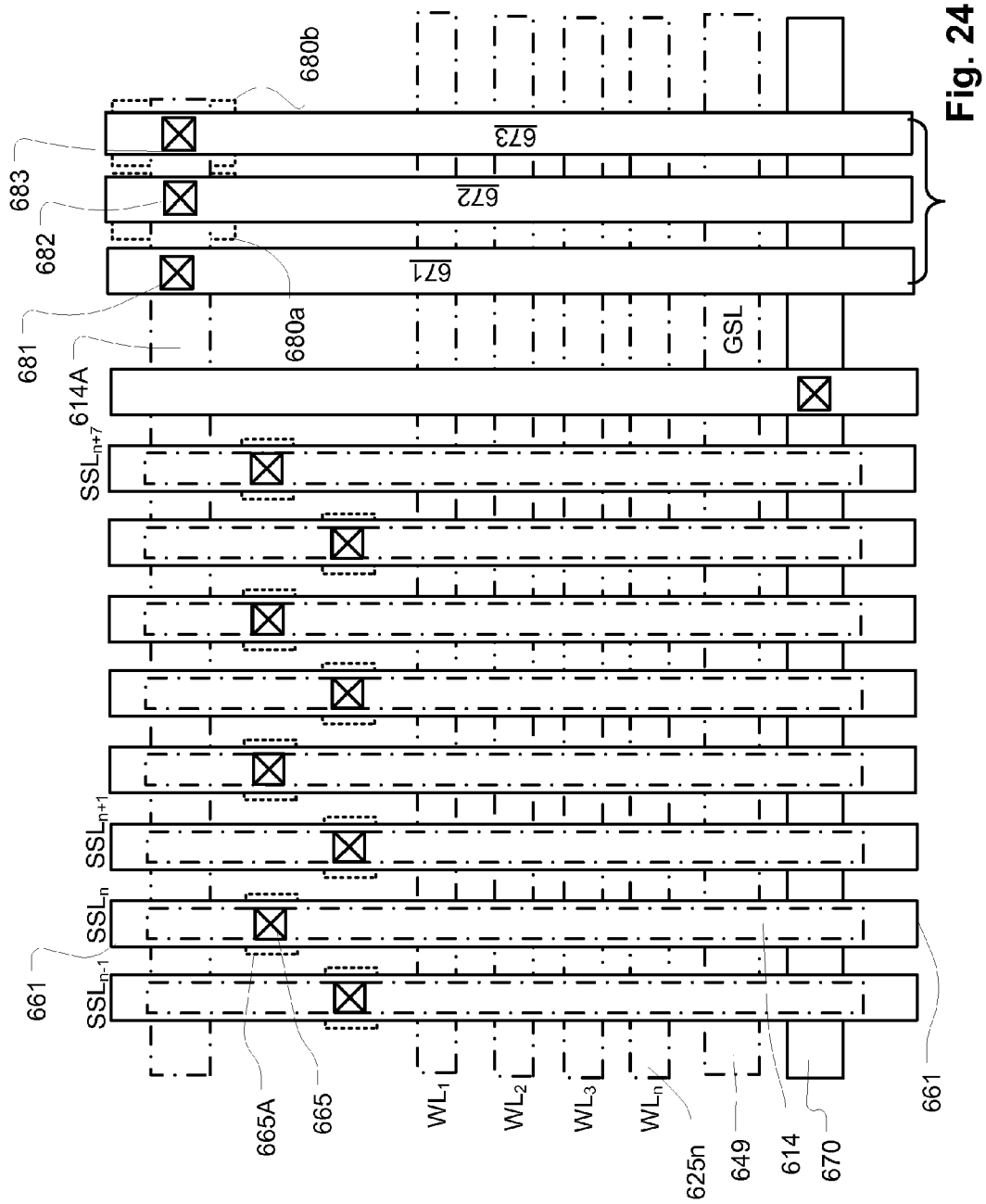
FIG. 24 is a layout view for a device like that of FIG. 23, showing interconnection to plane decoding structures.

FIG. 24 provides a layout view showing the layout of the SSL lines (e.g. 661) and bit lines 671-673, which overlie the ridge-shaped stacks, including semiconductor material strips 614, and the conductive lines 625n which act as word lines. The word lines extend to row decoder circuits. Also a GSL select line 649 lies beneath the SSL lines as shown, and extends parallel to the word lines to a sector decoder. A metal common source line 670 extends beneath the SSL lines, parallel with the word lines.

As shown in the figure, contact plugs (e.g. 665) connect to the gate structures for selecting semiconductor material strips 614 to overlying SSL lines (e.g. 661). A so-called twisted layout can be utilized, where the gate structures are staggered in the manner shown in the drawing so that the alignment margins (e.g. 665A) for the process of patterning the conductive contact plugs 665 can be shared along multiple rows of contacts reducing the average pitch of the layout of the ridge-shaped stacks. The SSL lines extend to column decoder circuits.

FIG. 24 also illustrates the layout of the connection of the extensions (e.g. 614A) of the semiconductor material strips to bit lines. As shown, the extensions 614A extend outside of the array to a bit line area. Vias are opened in a staggered manner exposing an extension of a semiconductor material strip in each plane of the array. In this example, a contact plug 681 is made reaching a semiconductor material strip in a first plane. Contact plug 682 is made to the semiconductor material strip and a second plane. Contact plug 683 is made to a semiconductor material strip and a third plane, and so on. Noncritical alignment can be utilized for the formation of these contacts, with relatively broad tolerance as shown at 680 (e.g., 680a, 680b). Bit lines 671, 672, 673 connected to the contact plugs 681, 682, 683 extend parallel to the SSL lines, to plane decoder circuits and sense amplifiers. In the embodiment shown later, with the extensions that form a staircase structure terminating the strips, it is unnecessary for the extensions to extend beyond the edge of the array.

Figure 25:
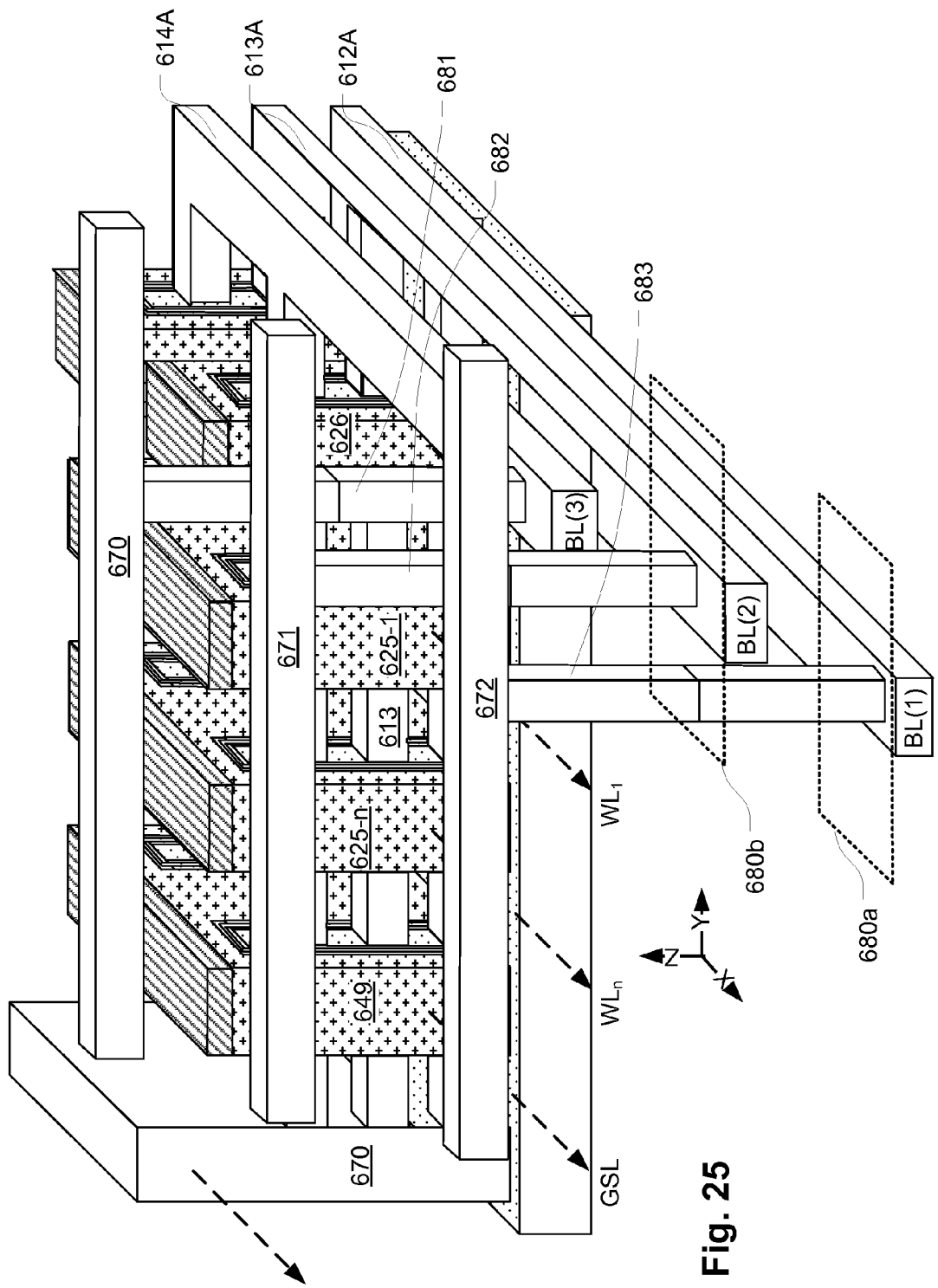
FIG. 25 is a perspective illustration showing bit line structures for plane decoding in a layout like that of FIG. 24.

FIG. 25 is a perspective where the Y- and Z-axes are in the plane of the paper, showing the structure for connecting the extensions 612A-614A to the contact plugs 683, 682, and 681 respectively. The overlying bit lines 670-672 are connected to the contact plugs. The alignment tolerance 680a, 680b for the conductive plugs 683-681 illustrates that the patterning for this step is a noncritical step, in that it does not impact the density of the array. Other reference numerals shown in the figure correspond to those used earlier for the same structures, and such structures are not described again.

Figure 26:
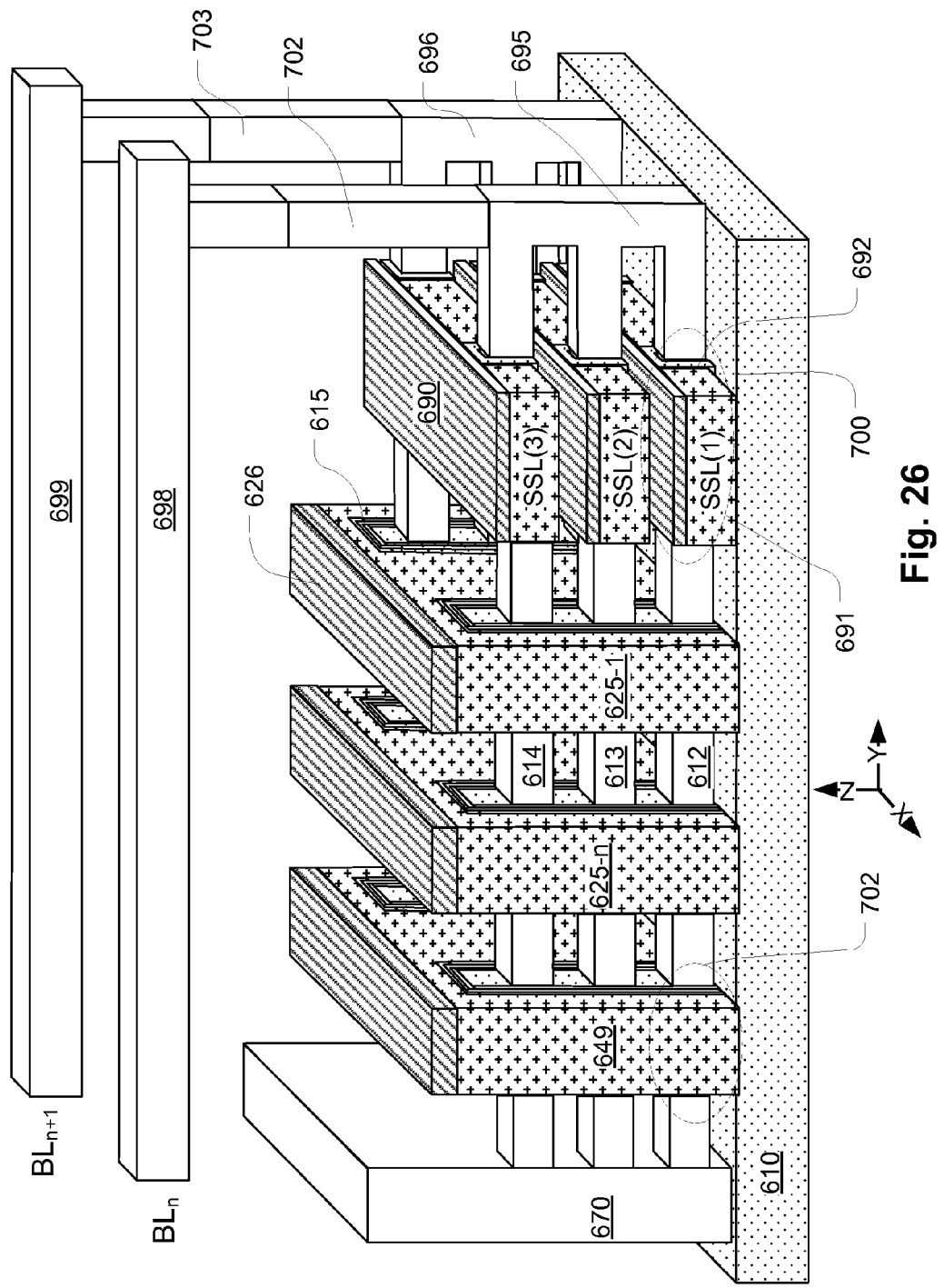
FIG. 26 is a perspective illustration showing alternative decoding structures for a NAND flash based memory.

FIG. 26 illustrates a perspective view for a NAND flash embodiment, with the Y-and Z-axes in the plane of the paper, of a different decoding layout compared to that of FIG. 23. In the embodiment of FIG. 26, an additional patterning process is used to define SSL lines (e.g. 691) and GSL lines (e.g. 649) using polysilicon for example, in each plane of the array layout in lines parallel to the conductive lines (e.g. 625-1). Transistors 700 and 702 are formed as a result of lines 691 and 649, using a semiconductor material strip (e.g. 612) as the channel regions. A layer 692 of gate dielectric is applied between the SSL lines 691 and the semiconductor material strips 612 and between the GSL line 649 and the semiconductor material strips 612. Silicide 690 can be applied over the SSL lines 491 and GSL lines 649. The SSL lines 691 extend outwardly from the array for connection to decoding circuitry as discussed below. Overlying bit lines 698 and 699 are coupled to the semiconductor material strips 612, 613, 614 in respective ridge-shaped stacks, by opening vias through the structure, and forming contact structures 695, 702, 696, 703 within the vias.

Figure 27:
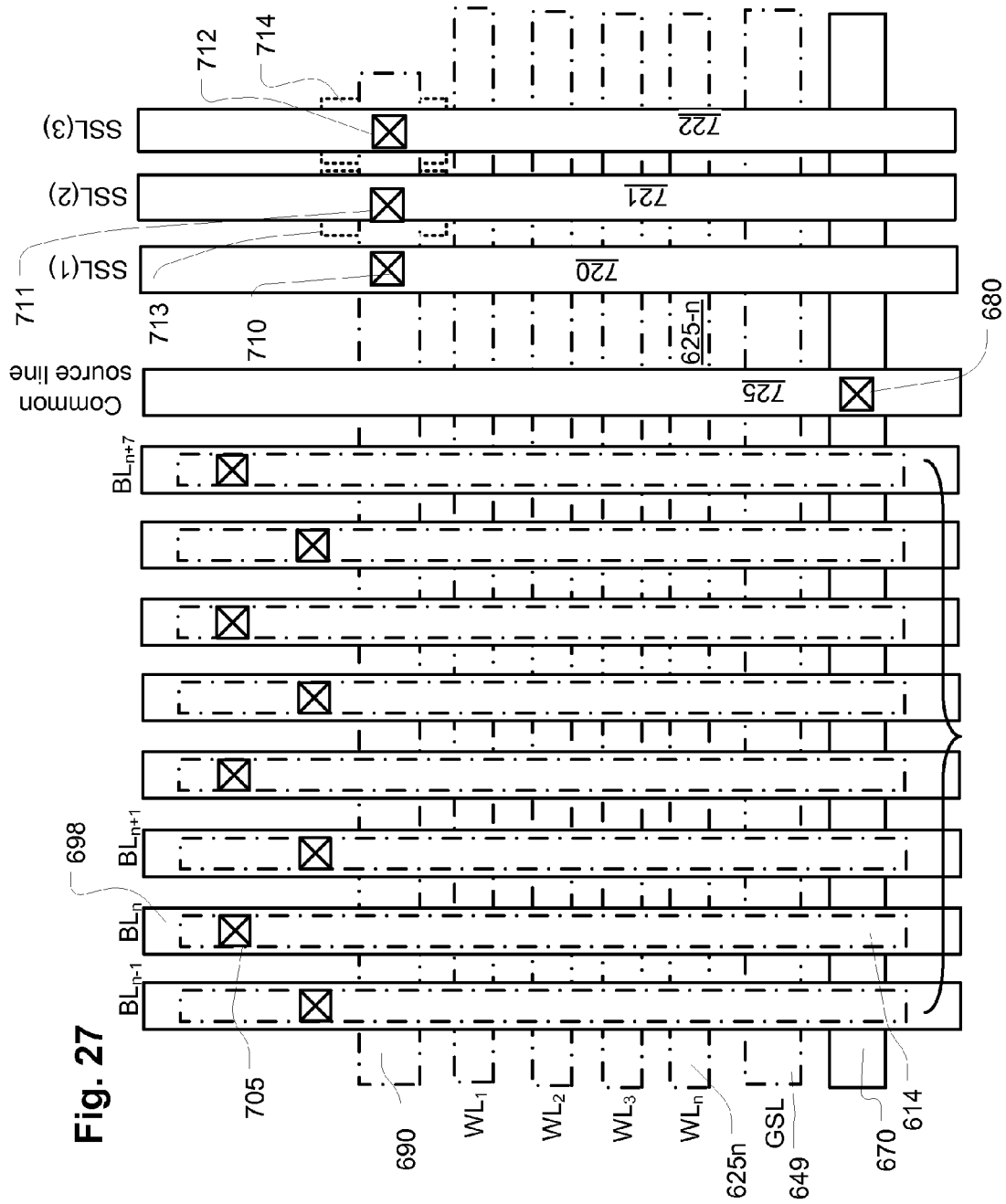
FIG. 27 is a layout view for a device like that of FIG. 26.

FIG. 27 illustrates a layout view for the decoding scheme of FIG. 26. As shown, contacts (e.g. 705) can be formed between the semiconductor material strips (e.g. 614) and the bit lines (e.g. 698). The contacts can be arranged in a staggered fashion so that the alignment margin is shared among the plurality of columns.

The SSL lines (e.g. 649) extend outward from the array to a region where overlying global SSL lines 720, 721, 722 are arranged. Contact plugs 710, 711, 712 are formed in vias which reach SSL lines in respective planes of the array to the global SSL lines 720, 721, 722. Again, noncritical alignment margins (e.g. 713, 714) can be applied during the layout of this structure. In this example, the SSL lines extend to plane decoder circuitry. In the embodiment shown later, with the extensions that form a staircase structure terminating the strips, it is unnecessary for the extensions to extend beyond the edge of the array. The bit lines extend to column decoder circuitry and sense amplifiers, which can be arranged in a page buffer structure allowing for wide, parallel read and write operations. The word lines extend to row decoder circuitry.

A GSL select line 649 lies beneath the bit lines as shown, and extends parallel to the word lines to a sector decoder. A metal common source line 670 extends beneath the bit lines, parallel with the word lines (e.g. 625n), to a contact plug 680 and up to a common source line 725 over the array.

Figure 28:
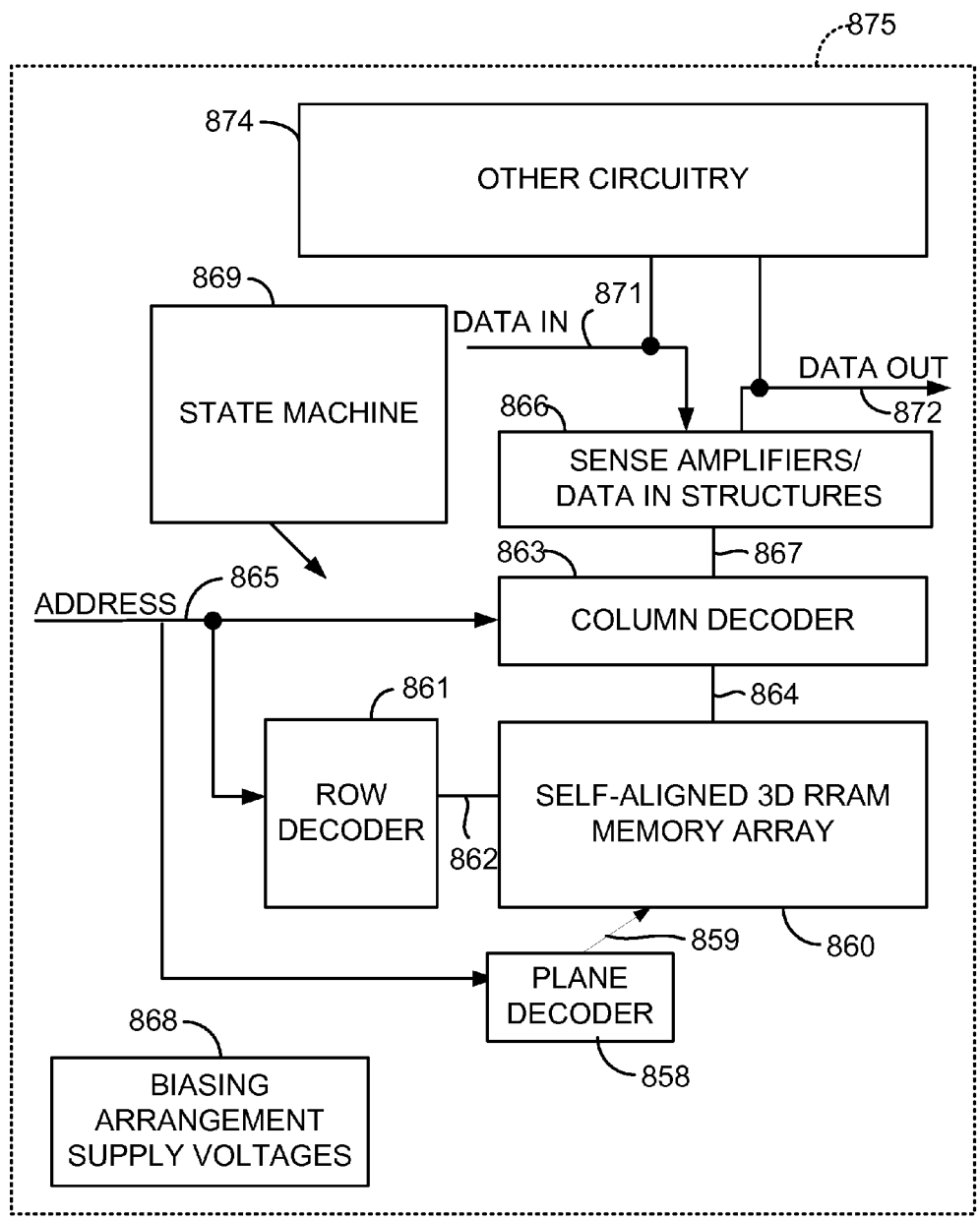
FIG. 28 is a schematic diagram of an integrated circuit including a 3D programmable resistance memory array with row, column and plane decoding circuitry.

FIG. 28 is a simplified block diagram of an integrated circuit according to an embodiment of the present technology. The integrated circuit line 875 includes a 3D programmable resistance memory array 860 (RRAM) implemented as described herein, on a semiconductor substrate. A row decoder 861 is coupled to a plurality of word lines 862, and arranged along rows in the memory array 860. A column decoder 863 is coupled to a plurality of bit lines 864 (or SSL lines as described above) arranged along columns in the memory array 860 for reading and programming data from the memory cells in the array 860. A plane decoder 858 is coupled to a plurality of planes in the memory array 860 on SSL lines 859 (or bit lines as described above). Addresses are supplied on bus 865 to column decoder 863, row decoder 861 and plane decoder 858. Sense amplifiers and data-in structures in block 866 are coupled to the column decoder 863 in this example via data bus 867. Data is supplied via the data-in line 871 from input/output ports on the integrated circuit 875 or from other data sources internal or external to the integrated circuit 875, to the data-in structures in block 866. In the illustrated embodiment, other circuitry 874 is included on the integrated circuit, such as a general purpose processor or special purpose application circuitry, or a combination of modules providing system-on-a-chip functionality supported by the programmable resistance cell array. Data is supplied via the data-out line 872 from the sense amplifiers in block 866 to input/output ports on the integrated circuit 875, or to other data destinations internal or external to the integrated circuit 875.

A controller implemented in this example using bias arrangement state machine 869 controls the application of bias arrangement supply voltage generated or provided through the voltage supply or supplies in block 868, such as read and program voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 29:
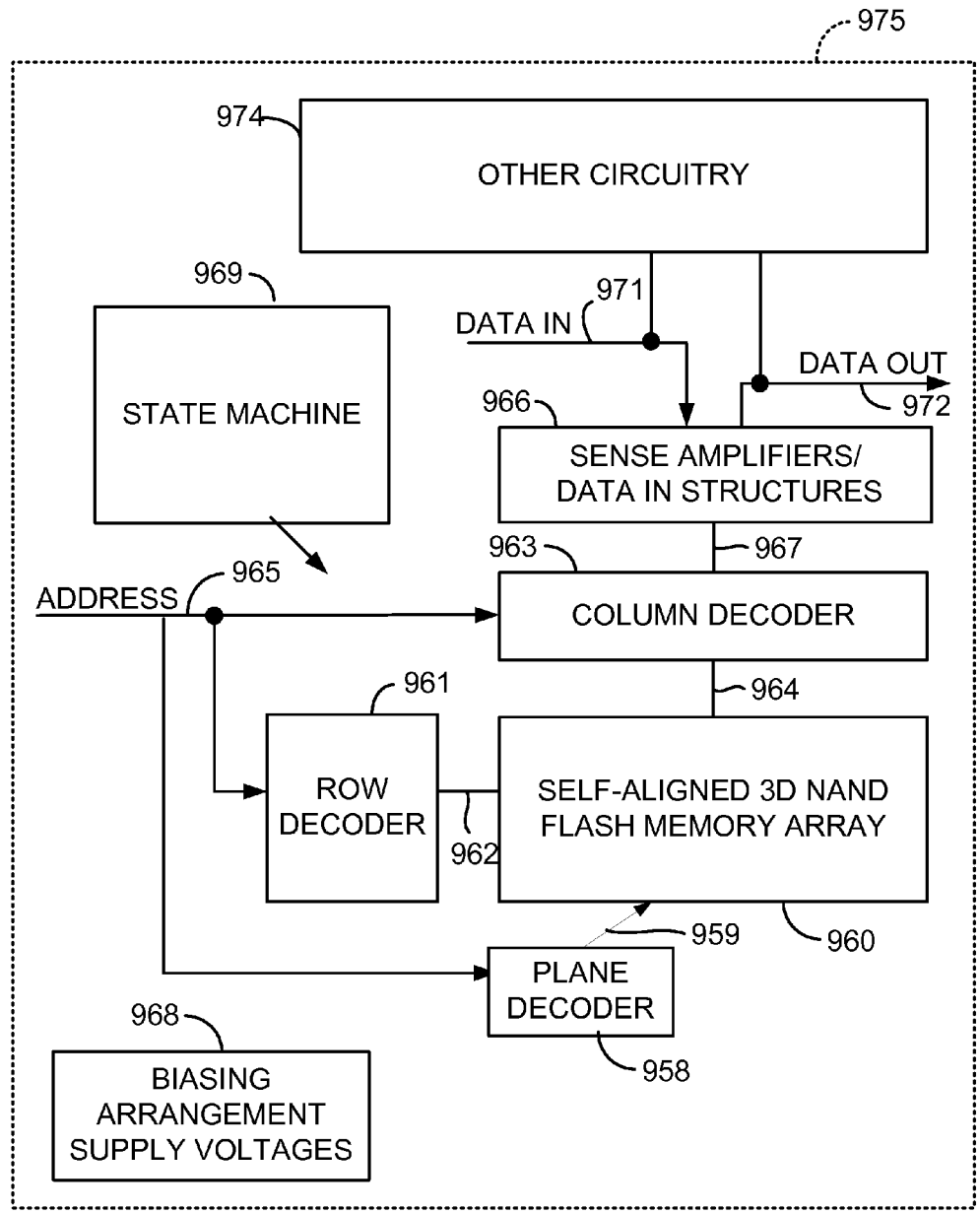
FIG. 29 is a schematic diagram of an integrated circuit including a 3D NAND-flash memory array with row, column and plane decoding circuitry.

FIG. 29 is a simplified block diagram of an integrated circuit according to an embodiment of the present technology. The integrated circuit line 975 includes a 3D NAND flash memory array 960, implemented as described herein, on a semiconductor substrate. A row decoder 961 is coupled to a plurality of word lines 962, and arranged along rows in the memory array 960. A column decoder 963 is coupled to a plurality of bit lines 964 (or SSL lines as described above) arranged along columns in the memory array 960 for reading and programming data from the memory cells in the array 960. A plane decoder 958 is coupled to a plurality of planes in the memory array 960 via SSL lines 959 (or bit lines as described above). Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 30:
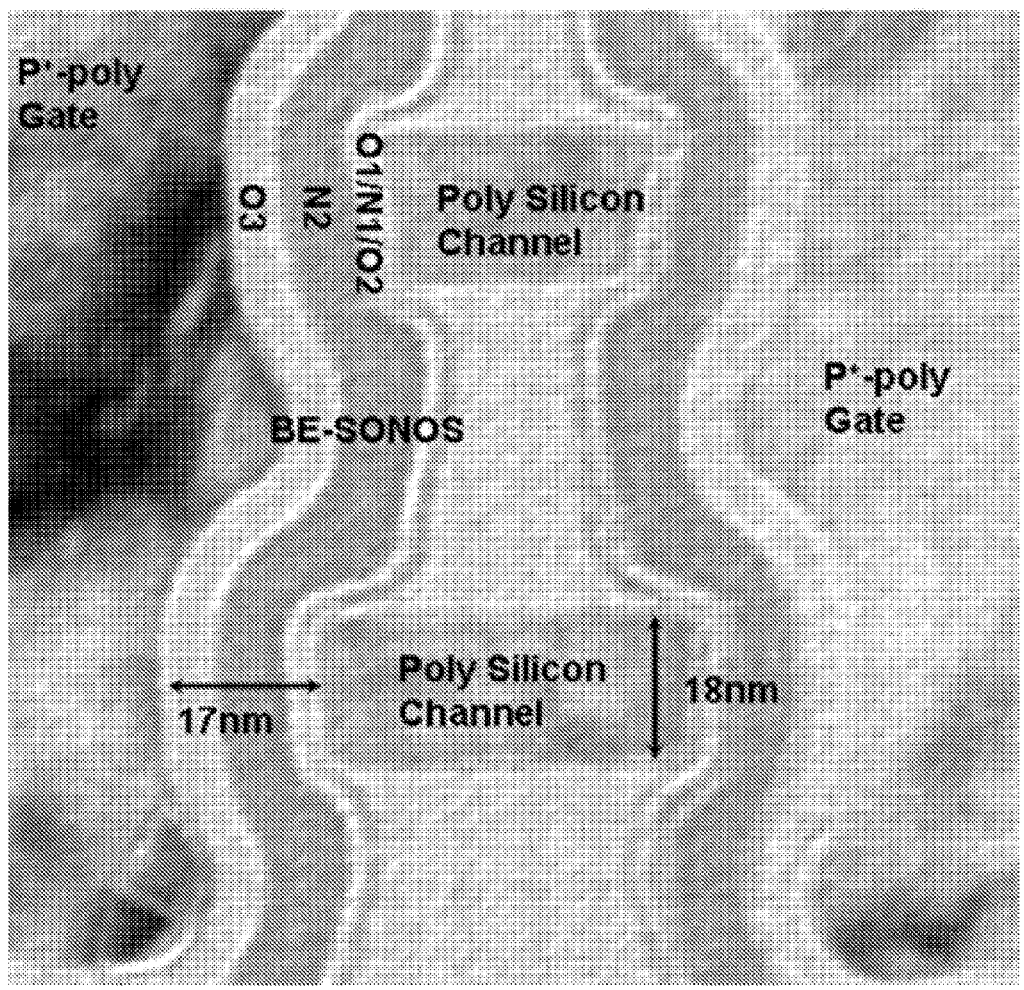
FIG. 30 is a transmission electron microscope TEM image of a portion of 3D NAND-flash memory array.

FIG. 30 is a TEM cross-section of a portion of an 8-layer vertical gate, thin-film-transistor, BE-SONOS charge trapping NAND device which has been fabricated and tested, arranged for decoding as shown in FIGS. 8 and 23. The device was made with a 75 nm half pitch. The channels were n-type polysilicon about 18 nm thick. No additional junction implant was used, resulting in a junction free structure. The insulating material between the strips to isolate the channels in the Z-direction was silicon dioxide about 40 nm thick. The gates were provided by a p+-polysilicon line. The SSL and GSL devices had longer channel lengths than the memory cells. The test device implemented 32 word line, junction-free NAND strings. The width of the lower strip in FIG. 30 is greater than the width of the upper strip because the trench etch used to form the structure resulted in a tapered side wall with progressively wider strips as the trench becomes deeper, and with the insulating material between the strips being etched more than the polysilicon.

The device can be programmed using positive gate voltage for Fowler-Nordheim electron tunneling. A self-boosting, incremental step pulsed programming (ISSP) process can be applied. The bias voltages applied to program a selected cell can be understood with reference to FIG. 8, and the disturbance of neighboring cells can be discussed. To program the cell A (ref number 74) at $BL_N$, $SSL_n$ and $WL_n$, a program potential is applied to $WL_n$, $SSL_n$ is set to Vcc (about 3.3 Volts), and the bit line $BL_N$ is set at about 0 Volts. The GSL is also set to about 0 V. $WL_{n-1}$ and $WL_{n+1}$ (as well as other word lines in the string) are set to a pass voltage. $SSL_{n-1}$ and $SSL_{n+1}$ (as well as other string select lines in the cube) are set to about 0 Volts. The other bit lines, e.g. bit line $BL_0$, are set to about 3.3 Volts to inhibit disturb. The GSL is also set to about 0 V. An ISSP process including a stepped program potential on the word line can be applied using a range of program potentials in a range from about +14 Volts to about +20 Volts. The pass voltage applied to other word lines can be about 10 Volts.

The disturb conditions for neighboring cells resulting from this program bias are described for cell B (ref. number 77) on $BL_N$, $WL_n$, $SSL_{n+1}$ (the adjacent ridge in the same layer on the same word line), for cell C on $BL_0$, $WL_n$, $SSL_n$ (the same ridge in a different layer on the same word line), for cell D on $BL_0$, $WL_n$, $SSL_{n+1}$ (the adjacent ridge in a different layer on the same word line) and for cell E (ref. number 73) on $BL_N$, $WL_{n-1}$, $SSL_n$ (the same ridge in the same layer on an adjacent word line).

Cell B receives the program potential on its gate via $WL_n$ while the channel voltage is floating, which results in self-boosting. Thereby, program disturb is avoided.

Cell C receives the program potential on its gate via $WL_n$ but the channel voltage is floating, which results in self-boosting. Thereby, program disturb is avoided. However, for adjacent planes, interference can arise from fringing fields induced by voltage changes in Cell A. Thus, the isolation between the planes should be sufficient to inhibit Z-interference. Simulation suggests that the EOT of the insulating material between the planes should be at least 30 nm, and preferably about 40 nm or more to inhibit disturb due to Z-interference.

Cell D receives the program potential on its gate via $WL_n$ but the channel voltage is floating, which results in self-boosting. Thereby, program disturb is avoided.

Cell E receives the pass voltage on its gate via $WL_{n-1}$ while the channel is coupled to about 0V via the NAND string to $BL_N$. The pass voltage for program should be on the order of 10 Volts so as to inhibit disturb for this cell.

The device can be erased using negative gate voltage for Fowler-Nordheim hole tunneling. To apply an erase voltage in the range of −16 to −12 Volts, the selected wordline can be set to receive the erase voltage, the other word lines in the string receive a pass voltage and the selected bit line can be set to about 0 Volts.

The 3D, buried channel, vertical gate NAND array described here is suitable for scaling to very small dimensions, as the channel width dimension is dependent to a large degree on the thickness of the semiconductor material strips rather than their width. The spacing limitations therefore are limited by the trench width requirements for deposition of the charge trapping structures and word line fill, and the minimum feature sizes achievable for stack widths. Furthermore, the structure can be manufactured with few masks steps, reducing cost per cell significantly.

Figure 31:
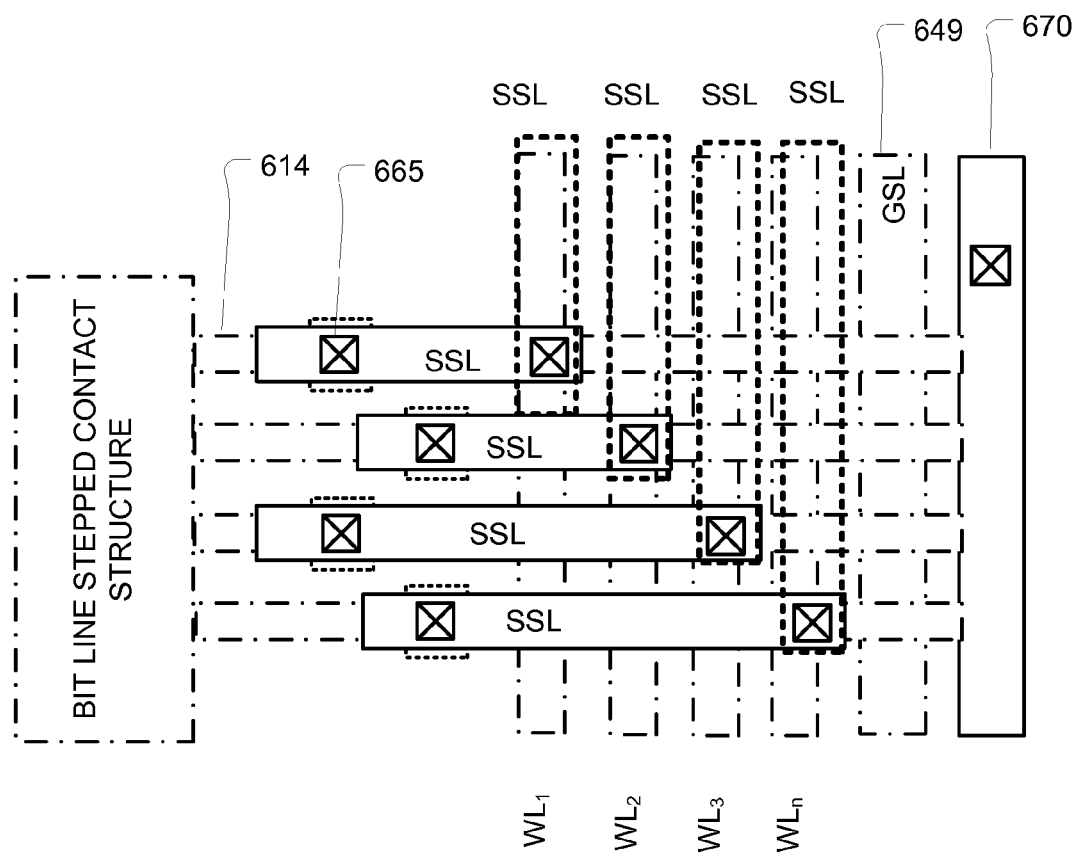
FIG. 31 shows a layout view of SSL select lines.

FIG. 31 illustrates a layout view supporting a very efficient array decoding and memory architecture design for 3D vertical gate (VG) NAND Flash or other memory technology. FIG. 31 provides a layout view (Compare FIG. 24) omitting bit lines, which overlie the ridge-shaped stacks and overlie the SSL metal lines. The word lines extend to row decoder circuits. Also a GSL select line 649 lies beneath the SSL lines, and extends parallel to the word lines to a sector decoder. A metal common source line 670 extends beneath the SSL lines, parallel with the word lines.

As shown in the figure, contact plugs (e.g. 665) connect to the gate structures for selecting semiconductor material strips 614 to overlying SSL line segments parallel with the ridge-shaped stacks. A so-called twisted layout can be utilized, where the gate structures are staggered in the manner shown in the drawing so that the alignment margins for the process of patterning the conductive contact plugs 665 can be shared along multiple rows of contacts reducing the average pitch of the layout of the ridge-shaped stacks. The SSL segments reach part way along the ridge-shaped stacks, with staggered ends. The ends are staggered for example, so that the bottom-most SSL segment reaches a region over the right-most word line, the next SSL segment to the top reaches a region over a second bottom-most word line, a next SSL segment to the top reaches a region over a third bottom-most word word line and so on. Contacts are placed at the staggered ends of the SSL segments for contact to overlying horizontal SSL lines that extend parallel to the word lines to SSL decoding circuits, which can be placed in a row decoding region of the layout with word line decoding circuits. The SSL line pitch can be greater than the WL pitch, so that an example layout might have 32 word lines (plus a GSL line) per cube of strings, and 16 ridge shaped stacks, that are 8 layers deep. The results in the use of 16 horizontal SSL lines over 32 WLs extending to a row decoding area. 8 bit lines couple to the eight channel layers over the 16 ridge shaped stacks. So that word lines are decoded to select rows, SSL lines are decoded to select columns and BLs are decoded to select planes. This provides a cube structure with 32×16×8 cells. Of course other combinations of word line, SSL and bit line counts can be implemented. Dummy word lines can be added, such as 2 dummy word lines per string.

FIG. 31 illustrates by the box labeled "bit line stepped contact structure" which can be implemented as described below, providing plane decoding, and coupling the selected planes to sense amplifiers. Vias are opened in a staggered or stair step manner exposing an extension of a semiconductor material strip in each plane of the array. Noncritical alignment can be utilized for the formation of these contacts, with relatively broad tolerance.

The array layout shown can be repeated in a mirror symmetrical pattern, with adjacent cubes on the stair step bit line end sharing the contacts, and adjacent cubes on the ground line, sharing the common source lines.

Figure 32:
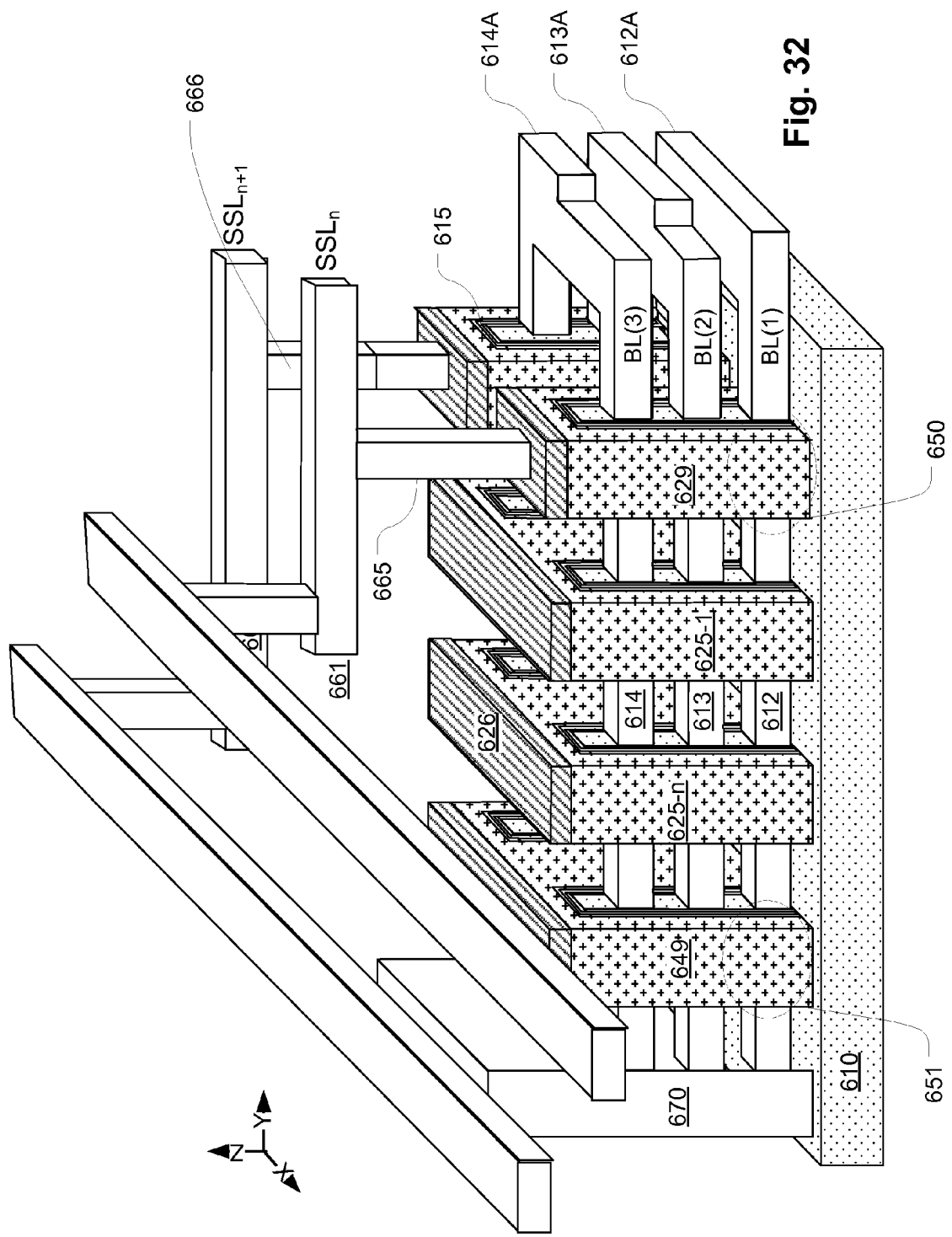
FIG. 32 shows an alternative embodiment of a memory array with a staircase structure terminating the bit line planes.

FIG. 32 shows an alternative embodiment of a memory array with a staircase structure terminating the bit line planes (Compare FIG. 23). Like reference numerals are utilized in this figure, and not described again. The structure shown in FIG. 32 shows results of removing the hard masks, exposing the silicide layers 626 along the top surfaces of the conductive lines 625-1 through 625-n, and over the gate structures 629 and 649. After an interlayer dielectric (not shown) is formed over the top of the array, vias are opened in which contact plugs 665, 666 using tungsten fill for example, are formed reaching to the top surfaces of the gate structures 629. Also a metal common source line 670 is formed in contact with the ends of the semiconductor material strips adjacent to the select transistors 651.

Overlying metal lines 661 and 662 are patterned to connect via the contact plugs 665, 666 to SSL gates, and to column decoder circuits. In this drawing, the twisted gate layout is not shown, but it is preferred.

The semiconductor material strip extensions 612A, 613A, 614A form a staircase structure that terminates the semiconductor material strips 612, 613, 614. These extensions 612A, 613A, 614A can be patterned at the same time that the plurality of ridge-shaped stacks are defined.

Figure 33:
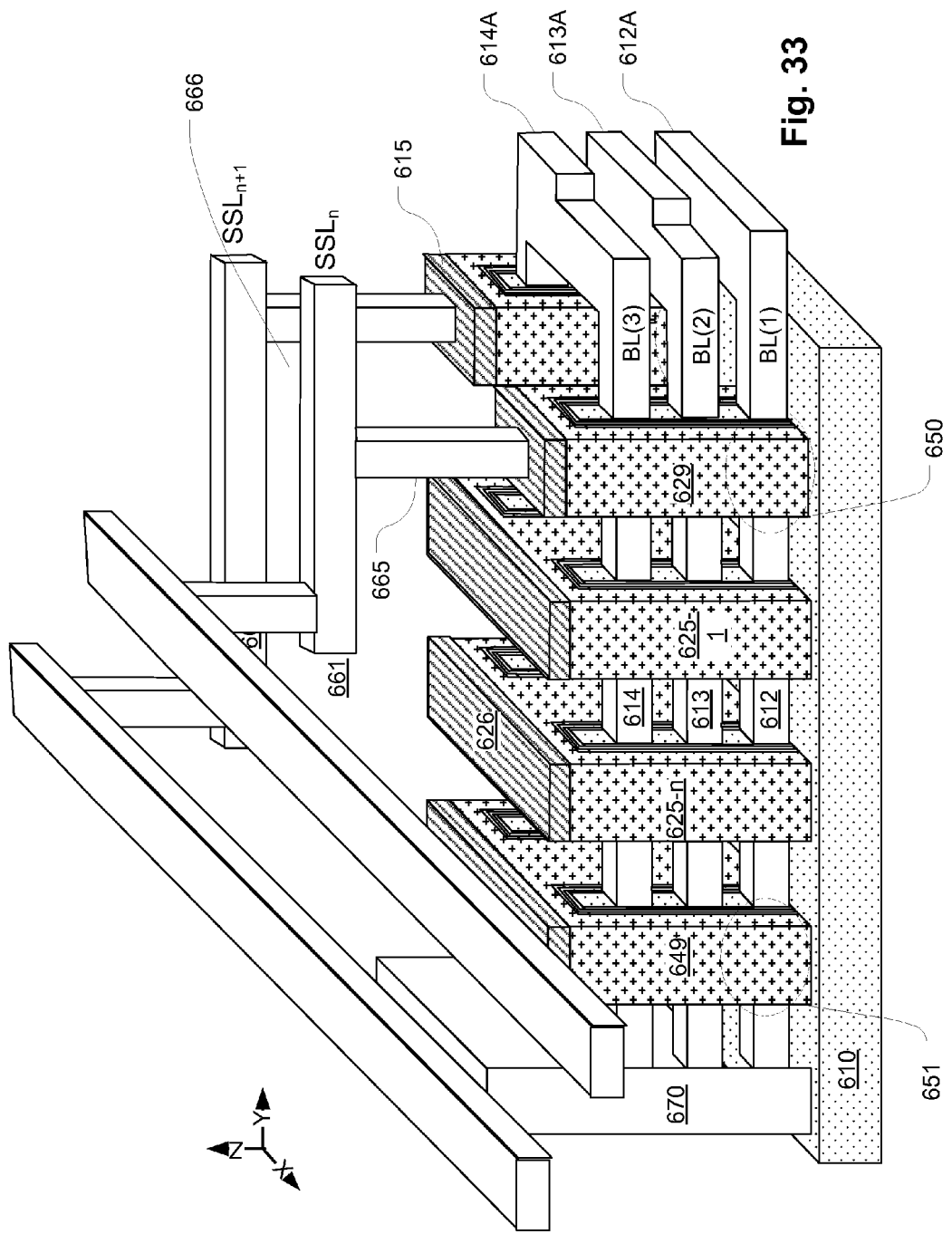
FIG. 33 shows an alternative embodiment of a memory array with a staircase structure terminating the bit line plane, and with staggered contact plugs that connect to SSL lines.

FIG. 33 shows an alternative embodiment of a memory array with a staircase structure terminating the bit line plane, and with staggered contact plugs that connect to SSL lines. (Compare FIG. 32)

Overlying metal lines 661 and 662 are patterned to connect via the contact plugs 665, 666 to SSL gates, and to column decoder circuits. In this drawing, the twisted gate layout is shown. The gate structures are staggered in the manner shown in the drawing so that the alignment margins for the process of patterning the conductive contact plugs can be shared along multiple rows of contacts reducing the average pitch of the layout of the ridge-shaped stacks.

Figure 34:
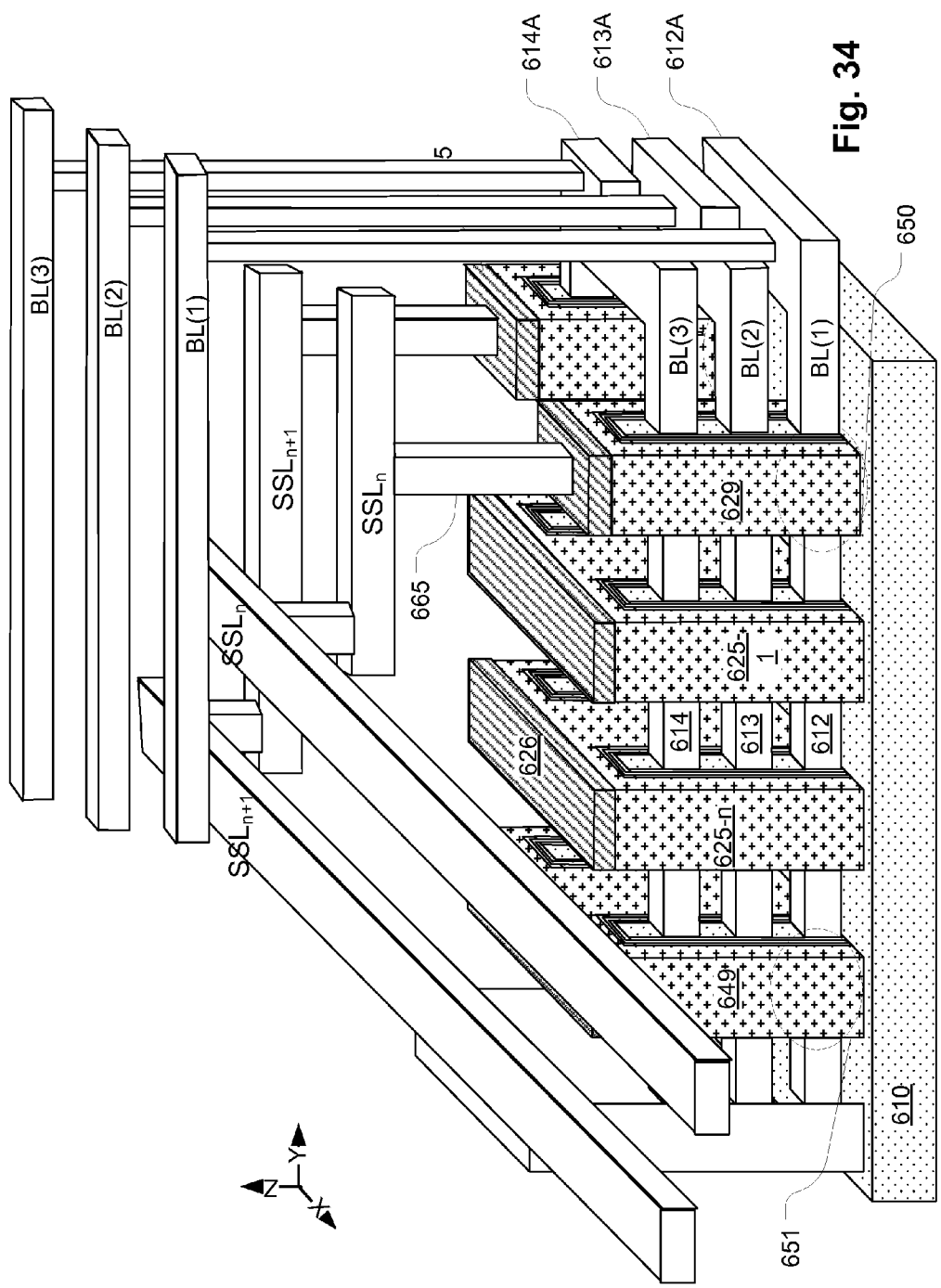
FIG. 34 shows a following stage in a process for manufacturing a memory array shown in part in FIG. 33, where the bit line contacts connect to different steps of the staircase structure.

FIG. 34 shows a following stage in a process for manufacturing a memory array shown in part in FIG. 33, where the bit line contacts connect to different steps of the staircase structure. (Compare FIG. 33)

The SSL segments can be seen, parallel to the ridge shaped stacks, which reaches in a staggered fashion to contact plugs arranged to connect them to overlying SSL lines that run perpendicular to the ridge shaped stacks, and parallel to the word lines, as discussed above with reference to FIG. 31. The bit lines are also shown in this figure, and overly the SSL lines in a higher metal layer.

Figure 35:
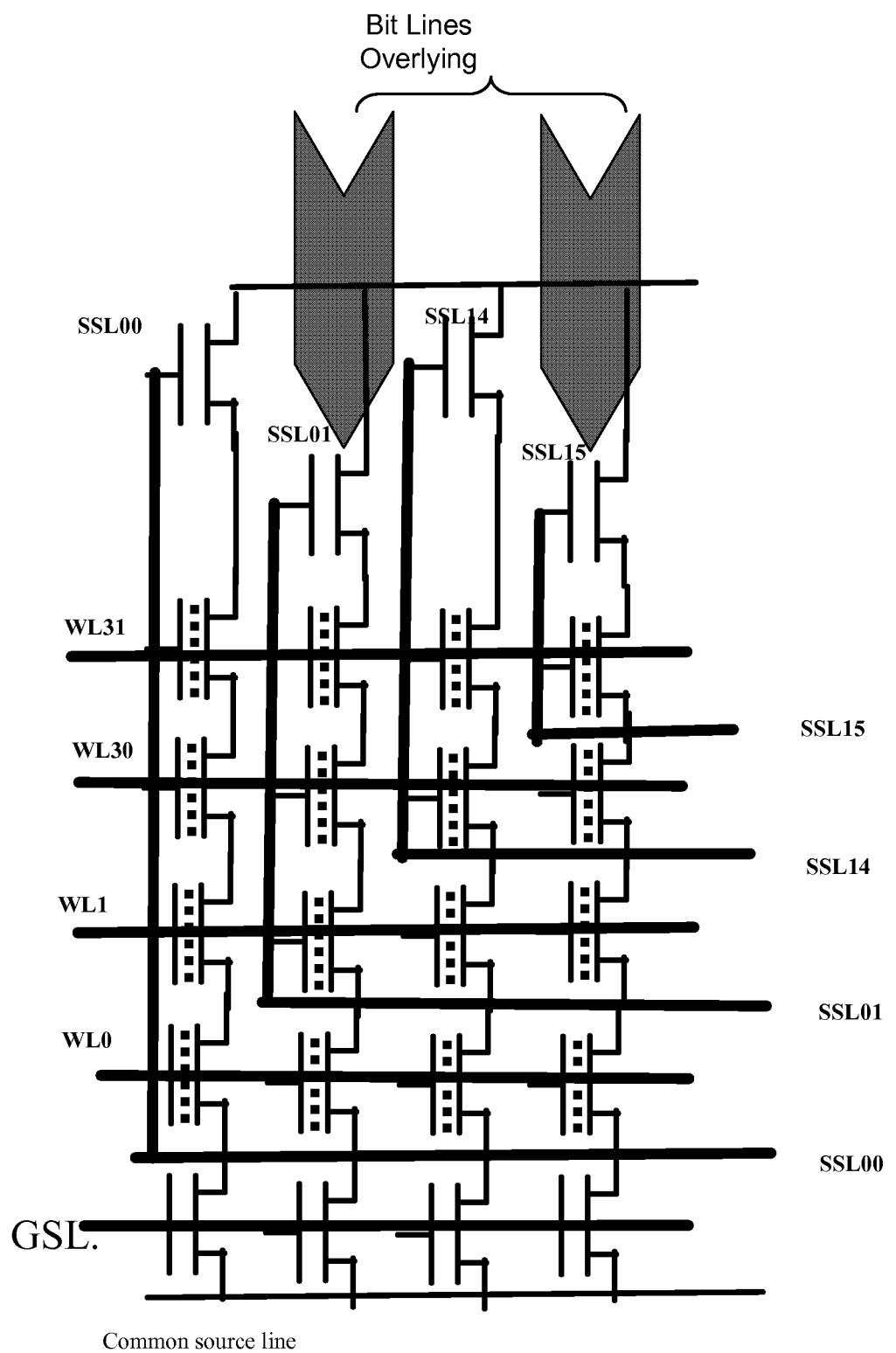
FIG. 35 is an array schematic for a NAND flash device implemented as described with reference to FIG. 34.

FIG. 35 is an array schematic for NAND flash device implemented as described with reference to FIGS. 31 and 32. A detail layout and design plane view for various technology nodes are illustrated. This proposal is very efficient and cost effective for a design that exceeds 128 Gb and terabit storage 3D NAND Flash memory.

Figure 36:
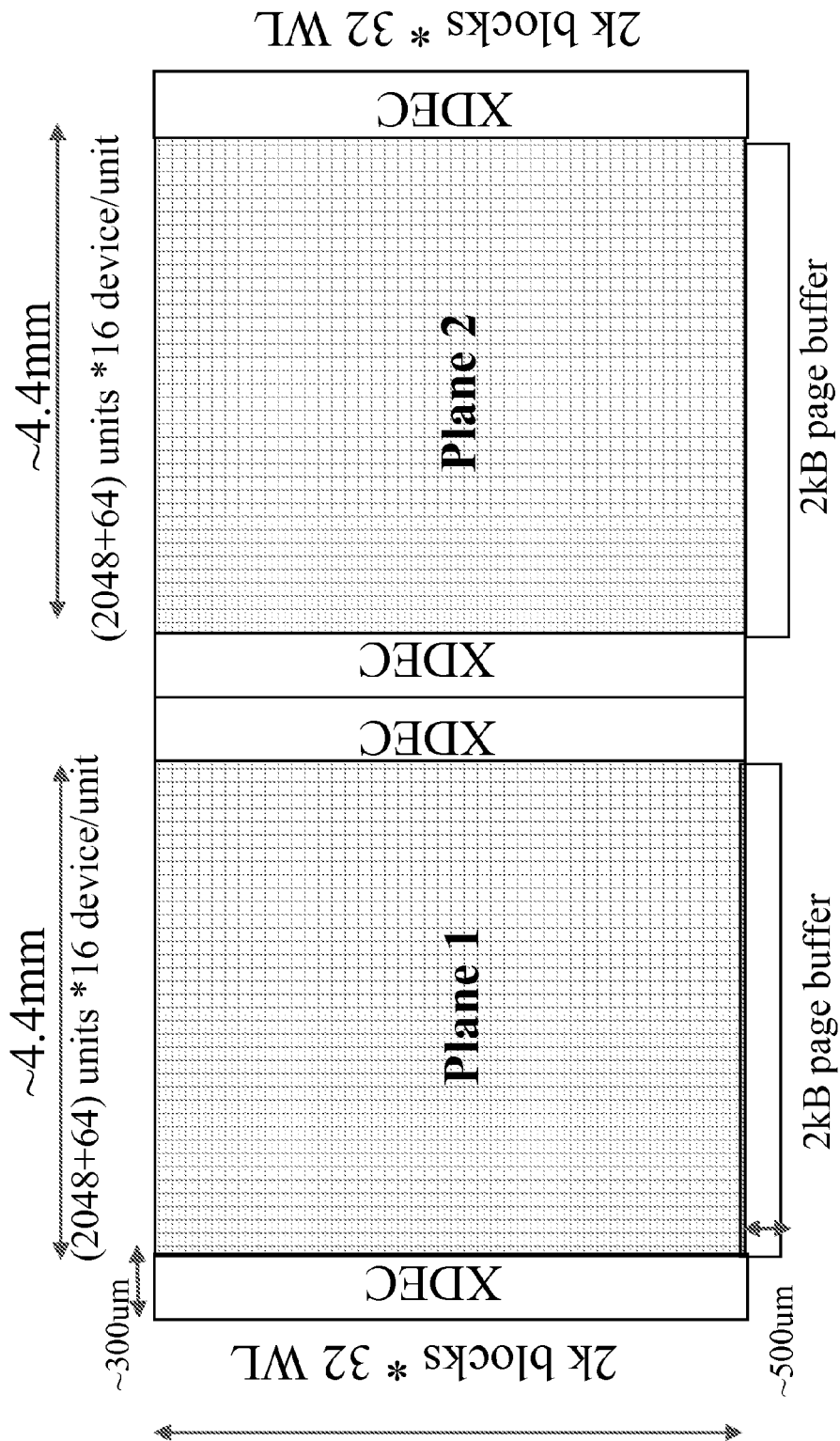
FIG. 36 shows a plan view for a possible two array implementation.

FIG. 36 shows a plan view for a possible two array implementation.

One embodiment has a 8 Gigabyte (8 GB) (equal to 64 Gigabit or 64 Gb) density: The details are as follows:

In both WL and DIFF (the SSL devices), the half pitch equals the 65 nm design rule. There are 8 memory layers of 3D VGNAND.

The BL (metal 3) pitch is 2*DIFF pitch of 130 nm=260 nm.
The SSL line (metal 2) pitch is 2*WL pitch=260 nm.
The density is 64 Gb (8-memory layers, Multi Level Cell (2 bits/cell))
Page size is 4 kB (2 bits/cell), Block size=2 MB=32*16 pages, Plane size=4 GB (2 k blocks)
Die size ~150 mm$^2$ (array=107 mm$^2$).

Another embodiment has a 64 Gigabyte (64 GB) (equal to 512 Gigabit or 512 Gb) density: The details are as follows:

In both WL and DIFF (the SSL devices), the half pitch equals the 32 nm design rule. There are 16 memory layers of 3D VGNAND.

The BL (metal 3) pitch is 2*DIFF pitch of 64 nm=128 nm.
The SSL line (metal 2) pitch is 2*WL pitch=128 nm.
The density is 512 Gb (8-memory layers, Multi Level Cell (2 bits/cell))
Page size is 8 kB (2 bits/cell), Block size=16 MB=64*32 pages, Plane size=32 GB (2 k blocks)
Die size ~140 mm$^2$ (array=97 mm$^2$).

The XDEC (row decoding) area size can be about 1.5× of conventional MLC NAND because of additional SSL's. XDEC on either one-side or two-sides are possible.

Other scaling scenarios are discussed below, with 2 bits per cell MLC operation:

With 8 memory layers, 128 Gb has 45 nm 4F$^2$; 256 Gb has 32 nm 4F$^2$; 256 Gb has 25 nm 5.1F$^2$ (X at 32 nm half pitch, Y at 25 nm half pitch)

With 16 memory layers, 512 Gb has 32 nm 4F$^2$ or 25 nm 5.1F$^2$

With 32 memory layers, 1 Tb has 42 nm 4F$^2$ or 25 nm 5.1F$^2$

In other embodiments, multiple planes of banks can be designed to fit for various technology nodes.

The layer number is not restricted to 8, 16, or 32. Other embodiments have various other numbers, such as other powers of 2 or half nodes such as 12 which is the half node in between 8 and 16.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    an integrated circuit substrate;
    a plurality of stacks of semiconductor material strips extending out of the integrated circuit substrate, the plurality of stacks including at least two semiconductor material strips separated by insulating material into different plane positions of a plurality of plane positions, different stacks of the plurality of stacks sharing a same staircase-shaped structure, the semiconductor material strips that share a same plane position of the plurality of plane positions being electrically coupled to a same bit line of a plurality of bit lines;
    the plurality of bit lines electrically coupled via a first plurality of conducting plugs to the plurality of stacks at the plurality of different plane positions, such that different bit lines distinguish different plane positions of the plurality of plane positions;
    a plurality of column select lines electrically coupled via a second plurality of conducting plugs to the plurality of stacks at the plurality of different plane positions, such that different column select lines of the plurality of column select lines distinguish different stacks of the plurality of stacks;
    wherein the first plurality of conducting plugs and the second plurality of conducting plugs electrically couple to the plurality of stacks at different locations along the plurality of stacks;
    a plurality of conductive lines arranged orthogonally over, and having surfaces conformal with, the plurality of stacks, such that a 3D array of interface regions is established at cross-points between surfaces of the semiconductor material strips and the plurality of conductive lines, wherein the plurality of conductive lines arranged across the plurality of stacks; and
    memory elements in the interface regions, which establish a 3D array of memory cells accessible via the plurality of semiconductor material strips and the plurality of conductive lines.

2. The memory device of claim 1, including
    decoding circuits coupled to the semiconductor material strips in the plurality of stacks and to the plurality of conductive lines for accessing the memory cells.

3. The memory device of claim 1, wherein the memory elements comprise an anti-fuse.

4. The memory device of claim 1, wherein the memory elements comprise a charge storage structure.

5. The memory device of claim 1, wherein the memory cells comprise buried channel charge storage transistors.

6. The memory device of claim 1, wherein the plurality of semiconductor material strips in the plurality of stacks comprise a doped semiconductor.

7. The memory device of claim 1, wherein the plurality of conductive lines comprise a doped semiconductor.

8. The memory device of claim 1, wherein said memory elements comprise portions of a common layer of memory material between the plurality of conductive lines and the plurality of stacks.

9. The memory device of claim 1, including a tunneling layer, a charge trapping layer and a blocking layer between the plurality of conductive lines and the plurality of stacks, and wherein said tunneling layer, charge trapping layer and blocking layer, in combination, form said memory elements in said interface regions.

10. A method for manufacturing a memory device, comprising:

forming a plurality of stacks of semiconductor material strips extending out of an integrated circuit substrate, the plurality of stacks including at least two semiconductor material strips separated by insulating material into different plane positions of a plurality of plane positions, different stacks of the plurality of stacks sharing a same staircase-shaped structure, the semiconductor material strips that share a same plane position of the plurality of plane positions being electrically coupled to a same bit line of a plurality of bit lines;

forming the plurality of bit lines electrically coupled via a first plurality of conducting plugs to the plurality of stacks at the plurality of different plane positions, such that different bit lines distinguish different plane positions of the plurality of plane positions;

forming a plurality of column select lines electrically coupled via a second plurality of conducting plugs to the plurality of stacks at the plurality of different plane positions, such that different column select lines of the plurality of column select lines distinguish different stacks of the plurality of stacks;

wherein the first plurality of conducting plugs and the second plurality of conducting plugs electrically couple to the plurality of stacks at different locations along the plurality of stacks;

forming a plurality of conductive lines arranged orthogonally over, and having surfaces conformal with, the plurality of stacks, such that a 3D array of interface regions is established at cross-points between surfaces of the semiconductor material strips and the plurality of conductive lines wherein the plurality of conductive lines arranged across the plurality of stacks; and forming memory elements in the interface regions, which establish a 3D array of memory cells accessible via the plurality of semiconductor material strips and the plurality of conductive lines.

* * * * *